United States Patent
Fujii et al.

(10) Patent No.: US 9,252,189 B2
(45) Date of Patent: Feb. 2, 2016

(54) NONVOLATILE SEMICONDUCTOR MEMORY ELEMENT, NONVOLATILE SEMICONDUCTOR MEMORY DEVICE, AND METHOD FOR MANUFACTURING NONVOLATILE SEMICONDUCTOR MEMORY DEVICE

(75) Inventors: Satoru Fujii, Osaka (JP); Kiyotaka Tsuji, Osaka (JP); Takumi Mikawa, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 148 days.

(21) Appl. No.: 13/996,203

(22) PCT Filed: Jun. 18, 2012

(86) PCT No.: PCT/JP2012/003958
§ 371 (c)(1),
(2), (4) Date: Jun. 20, 2013

(87) PCT Pub. No.: WO2013/001742
PCT Pub. Date: Jan. 3, 2013

(65) Prior Publication Data
US 2013/0270510 A1 Oct. 17, 2013

(30) Foreign Application Priority Data
Jun. 27, 2011 (JP) .................. 2011-142372

(51) Int. Cl.
*H01L 27/24* (2006.01)
*H01L 45/00* (2006.01)
(Continued)

(52) U.S. Cl.
CPC .......... *H01L 27/2409* (2013.01); *H01L 27/228* (2013.01); *H01L 27/2436* (2013.01);
(Continued)

(58) Field of Classification Search
CPC . H01L 29/66143; H01L 29/872; H01L 45/04; H01L 27/2409
See application file for complete search history.

(56) References Cited

U.S. PATENT DOCUMENTS 7,271,081 B2 9/2007 Li et al.
7,303,971 B2 12/2007 Hsu et al.
(Continued)

FOREIGN PATENT DOCUMENTS

JP 2006-203098 8/2006
JP 3913258 5/2007
(Continued)

OTHER PUBLICATIONS

S. Muraoka et al., "Fast switching and long retention Fe—O ReRAM and its switching mechanism", Electron Devices Meeting, 2007, IEDM 2007, IEEE International Dec. 10-12, 2007 (pp. 779-782.*
(Continued)

*Primary Examiner* — Tom Thomas
*Assistant Examiner* — John Bodnar
(74) *Attorney, Agent, or Firm* — Wenderoth, Lind & Ponack, L.L.P.

(57) ABSTRACT

A nonvolatile semiconductor memory element includes: a variable resistance element including a first electrode, a variable resistance layer, and a second electrode, and having a resistance value which changes according to a polarity of an electric pulse applied between the first electrode and the second electrode; and a current steering element which is electrically connected to the variable resistance element, allows a current to flow bidirectionally, and has a nonlinear current-voltage characteristic. The current steering element (i) has a structure in which a first current steering element electrode, a first current steering layer, and a second current steering element electrode are stacked in this order, and (ii) includes a second current steering layer which covers side surfaces of the first current steering element electrode, the first current steering layer, and the second current steering element electrode.

6 Claims, 23 Drawing Sheets

(51) Int. Cl.
*H01L 29/66* (2006.01)
*H01L 29/872* (2006.01)
*H01L 27/22* (2006.01)

(52) U.S. Cl.
CPC ...... *H01L27/2463* (2013.01); *H01L 29/66143* (2013.01); *H01L 29/872* (2013.01); *H01L 45/04* (2013.01); *H01L 45/06* (2013.01); *H01L 45/1233* (2013.01); *H01L 45/145* (2013.01); *H01L 45/146* (2013.01); *H01L 45/16* (2013.01); *H01L 45/1608* (2013.01); *H01L 45/1616* (2013.01); *H01L 45/1625* (2013.01); *H01L 45/1675* (2013.01)

(56) References Cited

U.S. PATENT DOCUMENTS

| | | | |
|---|---|---|---|
| 7,446,010 | B2 | 11/2008 | Li et al. |
| 7,608,514 | B2 | 10/2009 | Hsu et al. |
| 7,633,108 | B2 | 12/2009 | Li et al. |
| 7,848,161 | B2 | 12/2010 | Inoue |
| 7,968,419 | B2 | 6/2011 | Li et al. |
| 8,022,502 | B2 | 9/2011 | Kanzawa et al. |
| 8,242,479 | B2 | 8/2012 | Kawashima et al. |
| 8,279,657 | B2 | 10/2012 | Takagi et al. |
| 8,394,669 | B2 | 3/2013 | Arita et al. |
| 2007/0015328 | A1 | 1/2007 | Hsu et al. |
| 2007/0015329 | A1 | 1/2007 | Li et al. |
| 2007/0015330 | A1 | 1/2007 | Li et al. |
| 2007/0015348 | A1 | 1/2007 | Hsu et al. |
| 2007/0284575 | A1 | 12/2007 | Li et al. |
| 2008/0006814 | A1 | 1/2008 | Hsu et al. |
| 2009/0014710 | A1* | 1/2009 | Kawashima et al. ............. 257/5 |
| 2009/0032817 | A1 | 2/2009 | Li et al. |
| 2009/0052225 | A1 | 2/2009 | Morimoto |
| 2009/0283736 | A1 | 11/2009 | Kanzawa et al. |
| 2010/0046272 | A1 | 2/2010 | Inoue |
| 2010/0264392 | A1 | 10/2010 | Kawashima et al. |
| 2010/0271860 | A1* | 10/2010 | Muraoka et al. ............. 365/148 |
| 2011/0051500 | A1 | 3/2011 | Takagi et al. |
| 2011/0220862 | A1 | 9/2011 | Arita et al. |
| 2011/0294259 | A1 | 12/2011 | Kanzawa et al. |
| 2012/0280199 | A1 | 11/2012 | Takagi |
| 2012/0327702 | A1 | 12/2012 | Takagi et al. |

FOREIGN PATENT DOCUMENTS

| | | | |
|---|---|---|---|
| JP | 2007-158325 | 6/2007 | |
| JP | 2007-311772 | 11/2007 | |
| JP | 2008-306011 | 12/2008 | |
| JP | 4427630 | 3/2010 | |
| JP | 4688979 | 5/2011 | |
| WO | 2008/149484 | 12/2008 | |
| WO | 2009/063645 | 5/2009 | |
| WO | WO 2009/063645 | * 5/2009 | |
| WO | WO2009/063645 | * 5/2009 | ............ H01L 27/105 |
| WO | 2010/064446 | 6/2010 | |
| WO | 2011/007538 | 1/2011 | |
| WO | 2011/064967 | 6/2011 | |

OTHER PUBLICATIONS

Z. Wei et al. "Highly Reliable TaOx ReRAM and Direct Evidence of Redox Reaction Mechanism", Electron Devices Meeting, 2008, IEDM 2008. IEEE International Dec. 15-17, 2008 (pp. 293-296).*
International Search Report issued Jul. 17, 2012 in International Application No. PCT/JP2012/003958.

* cited by examiner

W = 0.42 μm   ΔL = 0.08 μm

W = 0.42 μm   ΔL = 0.08 μm

NONVOLATILE SEMICONDUCTOR MEMORY ELEMENT, NONVOLATILE SEMICONDUCTOR MEMORY DEVICE, AND METHOD FOR MANUFACTURING NONVOLATILE SEMICONDUCTOR MEMORY DEVICE

TECHNICAL FIELD

The present invention relates to variable resistance nonvolatile semiconductor memory elements, and particularly relates to a nonvolatile semiconductor memory element in which a current steering element and a variable resistance element are connected in series.

BACKGROUND OF INVENTION

Background Art

With the progress of the digital technology of electronic devices in recent years, semiconductor memory elements of a nonvolatile type (hereinafter referred to as "nonvolatile semiconductor memory elements") with a large capacity have been actively developed for storing data, such as music, images, and information. For example, nonvolatile semiconductor memory elements which use ferroelectrics as capacity elements have already been used in many fields. Furthermore, different from the nonvolatile semiconductor memory element which uses such a ferroelectric capacitor, a variable resistance nonvolatile semiconductor memory element (hereinafter referred to as a "ReRAM") comprising a material which has a resistance value that changes in response to an electric pulse application and holds the changed state has been attracting attention in that it is easy to ensure consistency with a general semiconductor manufacturing process.

Conventionally, a cross-point ReRAM has been proposed to reduce the size and increase the capacity of a nonvolatile semiconductor memory element (e.g., see patent literature (PTL) 1). PTL 1 discloses a nonvolatile semiconductor memory element having a structure in which a diode is placed in series with respect to a variable resistance layer (i.e. a cross-point ReRAM). This is for avoiding effects from variable resistance layers in other rows or columns, when the resistance values of the variable resistance layers formed at cross-points where lines that are arranged in the row direction and column direction three-dimensionally cross are read.

FIG. 11 is a cross-sectional view showing a memory cell 480, a bit line 410, and a word line 420, which is obtained by cutting a nonvolatile semiconductor memory element 60 including a conventional variable resistance element by a plane along the direction of the bit line 410 (see PTL 1). A variable resistance layer 430, which stores information according to a change in electrical resistance caused by electrical stress, is positioned between an upper electrode 440 and a lower electrode 450. A variable resistance element 460 is thus formed. A two-terminal nonlinear element 470 that allows a current to flow bidirectionally and has a nonlinear current-voltage characteristic is formed above the variable resistance element 460. The memory cell 480 is formed of a series circuit including the variable resistance element 460 and the nonlinear element 470. The nonlinear element 470 is a two-terminal element having a nonlinear current-voltage characteristic similar to that of a diode or the like in which a current changes inconstantly with respect to a voltage change. A varistor (ZnO, $SrTiO_3$, or the like) is used in PTL 1. Moreover, the bit line 410 serving as an upper line is electrically connected to the nonlinear element 470, and the word line 420 serving as a lower line is electrically connected to the lower electrode 450 of the variable resistance element 460.

However, such a conventional cross-point memory cell array has a problem that a margin narrows when the memory cell array is read out. In a read operation, with application of a voltage between a bit line and a word line, a current flows to a selected bit line from a selected bit line through a selected variable resistance element. However at the same time, there is a current (leakage current) which flows via an unselected variable resistance element connected to the selected bit line, an unselected word line, an unselected variable resistance element connected to the unselected word line, an unselected bit line, an unselected resistor element connected to the unselected bit line, and the selected word line in the stated order.

More specifically, a read current in a cross-point memory cell array is a sum of the current of the selected variable resistance element and a leakage current, which reduces the change in read current with respect to an original change in resistance value of the variable resistance element. This causes problems such as deterioration of sensitivity at the time of reading, and increase in the consumption of electric current.

In response to this problem, for example, PTL 2 describes a technique of dividing an area of the entire cross-point memory cell array into smaller blocks by a transistor switch or the like. With this, it is possible to reduce the leakage path to an acceptable amount.

Furthermore, the current that flows in an unselected variable resistance element can be reduced by connecting in series a unidirectional diode to a variable resistance element. More specifically, when a diode is connected, a bias state of the path where an unselected word line, an unselected variable resistance element connected to the unselected word line, and an unselected bit line are connected in the stated order become a reverse-biased state. Thus, it is possible to reduce the leakage current in the path to be significantly small.

However, in variable resistance elements, there is (i) an unipolar variable resistance element in which operations of setting (change from high resistance to low resistance) and resetting (change from low resistance to high resistance) are performed by the application of a voltage pulse having one polarity, by changing the voltage value and (ii) a bipolar variable resistance element in which operations of the setting and the resetting are performed by the application of electric pulses having different polarities. In the case of using a write voltage that becomes reverse bias condition for a diode to change the resistance value, the above method cannot be applied (bipolar variable resistance element). However, the bipolar variable resistance element has a characteristic of high-speed writing both at the time of setting and resetting, and is regarded highly promising for realizing a high speed nonvolatile semiconductor memory element.

This problem (i.e., the leakage current in a cross-point memory cell array including a bipolar variable resistance element) can be dealt with by a method of using, instead of a unidirectional diode in which a current flows only in one direction, a bidirectional diode in which a current flows bidirectionally.

The bidirectional diode has a symmetrical characteristic for positive and negative bias conditions, and exhibits, in a region in which an absolute value of bias is small, a characteristic that is close to a reverse bias characteristic of a diode, and exhibits, in a region in which an absolute value of bias is large, a characteristic close to a forward characteristic of a diode.

At the time of writing and reading, when the bidirectional diode having such a characteristic is connected in series to a variable resistance element, a bidirectional diode connected to the selected variable resistance element operates in an on-region at high voltage, and a bidirectional diode connected to another variable resistance element operates in an off-region at low voltage.

Thus, in order to reduce a leakage current and increase margin at the time of reading, it is preferable that the current ratio between on-current in the high voltage region and an off-current in the low voltage region be large as much as possible.

PTL 3 discloses a configuration of a bidirectional diode having a conventional structure of metal electrode-semiconductor layer-metal electrode. The bidirectional diode has a stacked structure of an upper electrode (TiN)-semiconductor (Si)-a lower electrode (TiN/Pt).

However, the conventional bidirectional diode disclosed in PTL 3 has a problem that on/off current ratio cannot be increased. This is inferred so because a semiconductor layer (Si) in a diode has a uniform thickness, due to which the current flowing in the bidirectional diode flows in the entire surface of the semiconductor layer, and thus the off-current cannot be reduced and the on/off current ratio cannot be increased either.

CITATION LIST

Patent Literature

[PTL 1]
   Japanese Unexamined Patent Application Publication No. 2006-203098
[PTL 2]
   Japanese Patent No. 3913258
[PTL 3]
   Japanese Unexamined Patent Application Publication No. 2007-311772

SUMMARY OF INVENTION

A varistor is an element which can perform rectification according to the characteristics of the grain boundary of a material positioned between electrodes. However, in the case of a cross-point memory cell array in which a varistor is used as a current steering element that has a current-voltage characteristic that is bidirectionally symmetric and nonlinear, there is a problem that the characteristic can vary due to heat history during manufacturing processes, and the variable resistance element can break due to overcurrent in some cases.

On the other hand, the variable resistance element needs to be miniaturized to reduce power consumption of the variable resistance element and allow a resistance change phenomenon to be started easily. In a structure in which the variable resistance element and a current steering element are separated and are connected through a via or the like, it is possible to miniaturize only the variable resistance element. However, the above is not exactly suitable from a point of view of increasing density of nonvolatile semiconductor memory elements included in a nonvolatile semiconductor memory device. On the other hand, in an element structure in which a variable resistance element and a current steering element are directly stacked, the current steering element also needs to be miniaturized with the miniaturization of the variable resistance element. However, when the current steering element is simply miniaturized, an element area decreases and it becomes difficult to provide an adequate on-current. Furthermore, when a high voltage is applied to provide the on-current, there is a concern that the current steering element generates heat and a short occurs. In addition, in order to reduce leakage current to an unselected memory cell and increase a margin at the time of reading in the cross-point memory cell array, it is preferable that the current steering element included in the memory cell have a high ratio between an on-current in the high voltage region and an off-current in the low voltage region (on/off current ratio). Thus, the off-current also needs to be reduced at the same time.

In view of this, the present invention has as an object to provide a nonvolatile semiconductor memory element and a nonvolatile semiconductor memory device including (i) a bidirectional current steering element which, even when miniaturized, is capable of providing an adequate on-current and has high on/off current ratio to reduce a leakage current and (ii) a bipolar variable resistance element capable of operating at high speed, and a method for manufacturing such a nonvolatile semiconductor memory device.

In order to achieve the aforementioned object, an aspect of a nonvolatile semiconductor memory element according to the present invention includes: a variable resistance element including a first electrode, a variable resistance layer, and a second electrode, and having a resistance value which changes according to a polarity of an electric pulse applied between the first electrode and the second electrode; and a current steering element which is electrically connected to the variable resistance element, allows a current to flow bidirectionally, and has a nonlinear current-voltage characteristic, wherein the current steering element (i) has a structure in which a first current steering element electrode in a plane shape, a first current steering layer in a plane shape, and a second current steering element electrode in a plane shape are stacked in this order, and (ii) includes a second current steering layer which covers a side surface of the first current steering layer and at least a portion of a side surface of the first current steering element electrode and the second current steering element electrode. Note that the second current steering layer may be in a side wall shape, entirely covering the side surface of the first current steering element electrode, the side surface of the first current steering layer, and the side surface of the second current steering element electrode.

Note that, the nonvolatile semiconductor memory element according to the present invention is not limited to the structure which includes the variable resistance element and the current steering element including the above-described MSM diode, but may have a structure which includes the variable resistance element and the current steering element including a metal-insulator-metal (MIM) diode.

Furthermore, the present invention can also be realized as a nonvolatile semiconductor memory device including the above-described nonvolatile semiconductor memory element, and a method for manufacturing such a nonvolatile semiconductor memory device.

Bidirectional current steering elements included in a nonvolatile semiconductor memory element and a nonvolatile semiconductor memory device according to the present invention have a structure including a second current steering layer which covers a side surface of each of a first current steering element electrode, a first current steering layer, and a second current steering element electrode. Thus, an effective area (a cross-sectional area of the path through which a current flows) of a current steering element is larger than an effective area of a variable resistance element, which makes it possible to increase a current (on-current) in the state in which the applied voltage is high (on-state). In particular, it becomes possible to provide a current (on-current) even when a non-volatile semiconductor memory element is miniaturized, producing an advantageous effect of ensuring a stable operation even when density of a nonvolatile semiconductor memory elements included in the nonvolatile semiconductor memory devices is increased.

DETAILED DESCRIPTION OF INVENTION

Summary of the Present Invention

Figure 1A:
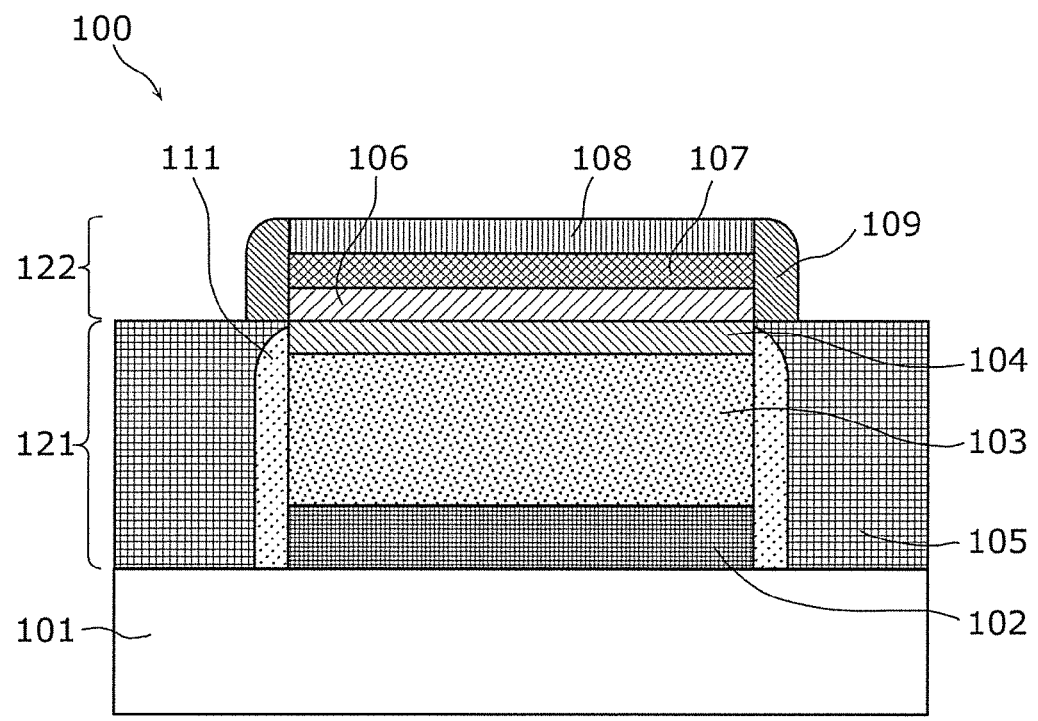
FIG. 1A is a cross-sectional view showing an exemplary configuration of a nonvolatile semiconductor memory element according to Embodiment 1 of the present invention.

An aspect of a nonvolatile semiconductor memory element according to the present invention includes a variable resistance element including a first electrode, a variable resistance layer, and a second electrode, and having a resistance value which changes according to a polarity of an electric pulse applied between the first electrode and the second electrode; and a current steering element which is electrically connected to the variable resistance element, allows a current to flow bidirectionally, and has a nonlinear current-voltage characteristic, wherein the current steering element (i) has a structure in which a first current steering element electrode in a plane shape, a first current steering layer in a plane shape, and a second current steering element electrode in a plane shape are stacked in this order, and (ii) includes a second current steering layer which covers a side surface of the first current steering layer and at least a portion of a side surface of the first current steering element electrode and the second current steering element electrode. The second current steering layer may be in a side wall shape, entirely covering the side surface of the first current steering element electrode, the side surface of the first current steering layer, and the side surface of the second current steering element electrode.

Thus, the bidirectional current steering element included in a nonvolatile semiconductor memory element according to the present invention has a structure including a second current steering layer which is connected to a side surface of each of a first current steering element electrode, the first current steering layer, and the second current steering element electrode. This makes it possible to increase a current (on-current) in the state in which the applied voltage is high (on-state). In particular, it becomes possible to provide a current (on-current) even when an element is miniaturized, producing an advantageous effect of ensuring a stable operation even when density of nonvolatile semiconductor memory elements included in the nonvolatile semiconductor memory device is increased.

Here, the first current steering layer may comprise silicon nitride, tantalum oxide, aluminum oxide, or titanium oxide, and the second current steering layer may comprise silicon nitride, tantalum oxide, aluminum oxide, or titanium oxide. Note that, each of the first current steering layer and the second current steering layer may comprise nitrogen-deficient silicon nitride. In this case, when the nitrogen-deficient silicon nitride included in the first current steering layer is denoted as $SiN_z$, and the nitrogen-deficient silicon nitride included in the second current steering layer is denoted as $SiN_w$, a relationship $z \geq w$ may be satisfied.

With the second current steering layer comprising the above-described material, it is believed that an amount of current flowing to the second current steering layer having higher degree of nitrogen deficiency increases. Thus, even when the nonvolatile semiconductor memory element is miniaturized, on-current of the current steering element as a whole can be increased.

Note that the variable resistance layer may include a first transition metal oxide layer and a second transition metal oxide layer which are stacked. In this case, (i) the second transition metal oxide layer may have a degree of oxygen deficiency lower than a degree of oxygen deficiency of the first transition metal oxide layer, (ii) a transition metal included in the first transition metal oxide layer and a transition metal included in the second transition metal oxide layer may be a same transition metal, or (iii) a transition metal included in the first transition metal oxide layer and a transition metal included in the second transition metal oxide layer may be different.

An aspect of a nonvolatile semiconductor memory device according to the present invention includes a substrate; lower electrode lines formed in a stripe pattern on the substrate; upper layer electrode lines which are formed in a stripe pattern and three-dimensionally cross the lower electrode lines; and a plurality of nonvolatile semiconductor memory elements formed at cross-points of the lower layer electrode lines and the upper layer electrode lines.

With this, a cross-point memory cell array including a nonvolatile semiconductor memory element which includes (i) a bidirectional current steering element which, even when miniaturized, is capable of providing an adequate on-current and has a high on/off current ratio to reduce a leakage current and (ii) a bipolar variable resistance element capable of operating at high speed is realized.

An aspect of a method for manufacturing a nonvolatile semiconductor memory device according to the present invention is a method for manufacturing a nonvolatile semiconductor memory device which includes (i) a variable resistance element including a first electrode, a variable resistance layer, and a second electrode, and having a resistance value which changes according to an electric pulse applied between the first electrode and the second electrode and (ii) a current steering element which is electrically connected to the variable resistance element, allows a current to flow bidirectionally, has a nonlinear current-voltage characteristic, and includes a first current steering element electrode, a first current steering layer, a second current steering layer, and a second current steering element electrode, the method comprising: forming lower electrode lines in a stripe pattern on a substrate; forming the first electrode on the lower layer electrode lines; forming the variable resistance layer on the first electrode; forming the second electrode on the variable resistance layer; forming an interlayer dielectric to cover a top surface of the substrate, a side surface of the first electrode, a side surface of the variable resistance layer, and a side surface of the second electrode; forming, on the second electrode, the first current steering element electrode in a plane shape; forming, on the first current steering element electrode, the first current steering layer in a plane shape; forming, on the first current steering layer, the second current steering element electrode in a plane shape; exposing a top surface of the second current steering element electrode and forming the second current steering layer which covers a side surface of the first current steering layer and at least a portion of a side surface of the first current steering element electrode and the second current steering element electrode, by performing anisotropic etching after depositing the second current steering layer on the top and the side surfaces of the second current steering element electrode, on the side surface of the first current steering layer, and on the side surface of the first current steering element electrode; and forming, on the second current steering element electrode, upper layer electrode lines which are in a stripe pattern and three-dimensionally cross the lower electrode lines.

These manufacturing processes make it possible to miniaturize a nonvolatile semiconductor memory device and achieve stable characteristics. Furthermore, the current steering element is directly stacked on the variable resistance layer, and the protective layer is provided on the side end surface of the variable resistance element. Thus, it is possible to reduce oxidization of the variable resistance layer at the time of formation of the interlayer dielectric.

Furthermore, another aspect of a method for manufacturing a nonvolatile semiconductor memory device according to the present invention is a method for manufacturing a nonvolatile semiconductor memory device which includes (i) a variable resistance element including a first electrode, a variable resistance layer, and a second electrode, and having a resistance value which changes according to an electric pulse applied between the first electrode and the second electrode and (ii) a current steering element which is electrically connected to the variable resistance element, allows a current to flow bidirectionally, has a nonlinear current-voltage characteristic, and includes a first current steering element electrode, a first current steering layer, a second current steering layer, and a second current steering element electrode, the method comprising: forming lower electrode lines in a stripe pattern on a substrate; forming, on the lower layer electrode lines, the first current steering element electrode in a plane shape; forming, on the first current steering element electrode, the first current steering layer in a plane shape; forming, on the first current steering layer, the second current steering element electrode in a plane shape; exposing a top surface of the second current steering element electrode and forming the second current steering layer which covers a side surface of the first current steering layer and at least a portion of a side surface of the first current steering element electrode and the second current steering element electrode, by performing anisotropic etching after depositing the second current steering layer on the top and the side surfaces of the second current steering element electrode, on the side surface of the first current steering layer, and on the side surface of the first current steering element electrode; and forming the first electrode on the second current steering element electrode; forming the variable resistance layer on the first electrode; forming the second electrode on the variable resistance layer; and forming, on the second electrode, upper layer electrode lines which are in a stripe pattern and three-dimensionally cross the lower layer electrode lines.

These manufacturing processes make it possible to miniaturize the nonvolatile semiconductor memory device and achieve stable characteristics. Furthermore, the variable resistance element is directly stacked on the current steering element. Thus, the second current steering layer can also play the role of the protective layer. Thus, it is possible to simplify the manufacturing process.

Note that, the nonvolatile semiconductor memory element according to the present invention is not limited to the structure which includes the variable resistance element and the current steering element including the above-described MSM diode, but may have a structure which includes the variable resistance element and the current steering element including a metal-insulator-metal (MIM) diode.

EMBODIMENTS

Hereinafter, embodiments of the present invention shall be described with reference to the Drawings. It should be noted that the embodiments described hereafter illustrate specific examples of the present invention. Numerical values, shapes, materials, structural elements, the positioning and connection configuration of the structural elements, steps, the sequence of the steps, and so on, described in the embodiments below are merely examples and are not intended to limit the present invention. Furthermore, among the structural elements in the following embodiments, those structural elements which are not described in the independent claims indicating the broadest concept are described as arbitrary structural elements.

It should be noted that the same elements are assigned the same reference signs and their descriptions may be omitted. Furthermore, in the drawings, the shapes of the transistor, the storage unit, and so on, are merely schematic, and their number, and so on, are set merely for convenient illustration.

Embodiment 1

FIG. 1A is a cross-sectional view showing an exemplary configuration of a variable resistance nonvolatile semiconductor memory element 100 according to Embodiment 1 of the present invention.

As shown in FIG. 1A, the variable resistance nonvolatile semiconductor memory element 100 according to Embodiment 1 includes: a substrate 101; a first electrode 102; a second electrode 104; a variable resistance layer 103 positioned between the two electrodes (the first electrode 102; and the second electrode 104); an interlayer dielectric 105; a first current steering element electrode 106 in a plane shape; a second current steering element electrode 108 in a plane shape; a first current steering layer 107 which is in a plane shape and is positioned between the two electrodes (the first current steering element electrode 106 and the second current steering element electrode 108); and a second current steering layer 109 which covers a side surface of each of the first current steering element electrode 106, the first current steering layer 107, and the second current steering element electrode 108. Here, "a plane shape" means a plate shape. Each of the first current steering element electrode 106, the second current steering element electrode 108, and the first current steering layer 107 is formed parallel to a main surface of the substrate 101.

Note that, in FIG. 1A, the second current steering layer 109 entirely covers the side surface of each of the first current steering element electrode 106, the first current steering layer 107, and the second current steering element electrode 108. However, it is acceptable that the second current steering layer 109 cover a side surface of the first current steering layer 107, and at least a portion of a side surface of the first current steering element electrode 106 and the second current steering element electrode 108. For example, as shown in FIG. 1E, the variable resistance nonvolatile semiconductor memory element 100 may have a structure in which the second current steering layer 109 does not cover the side surface of the second current steering element electrode 108, but covers the side surface of the first current steering layer 107 and the side surface of the first current steering element electrode 106. Note that, the nonvolatile semiconductor memory element shown in FIG. 1E is different from the nonvolatile semiconductor memory element shown in FIG. 1A only in that the second current steering layer 109 does not cover the side surface of the second current steering element electrode 108.

Furthermore, the substrate 101 and the interlayer dielectric 105 are not essential structural elements of the nonvolatile semiconductor memory element 100.

More specifically, main portion of the nonvolatile semiconductor memory element 100 according to this embodiment includes a variable resistance element 121 and a current steering element 122. The variable resistance element 121 includes the first electrode 102, the variable resistance layer 103, and the second electrode 104, and is an element having a resistance value that changes according to a polarity of an electric pulse applied between the first electrode 102 and the second electrode 104. The current steering element 122 is electrically connected to the variable resistance element 121, and is an element having a (bidirectional) nonlinear current-voltage characteristic and allows a current to flow bidirectionally. The current steering element 122 includes the first current steering element electrode 106 in a plane shape, the first current steering layer 107 in a plane shape, and the second current steering element electrode 108 in a plane shape that are stacked in this order, and also includes the second current steering layer 109 which covers the side surface of the first current steering layer and at least a portion of the side surface of the first current steering element electrode 106 and the second current steering element electrode 108.

Here, a perovskite metal oxide, an oxide of a typical metal or an oxide of a transition metal can be used as the variable resistance layer 103. More specifically, an example of the variable resistance material for forming a variable resistance thin film is: $Pr_{(1-x)}Ca_xMnO_3$ (0<x<1), $TiO_2$, $NiO_x$ (0<x<1), $ZrO_x$ (0<x<2), $FeO_x$ (0<x<1.5), $CuO_x$ (0<x<1), $AlO_x$ (0<x<1.5), $TaO_x$ (0<x<2.5), or the like or a substitution product thereof or a mixture, stacked structure, or the like thereof. The variable resistance material is, of course, not limited to these variable resistance materials.

Figure 1B:
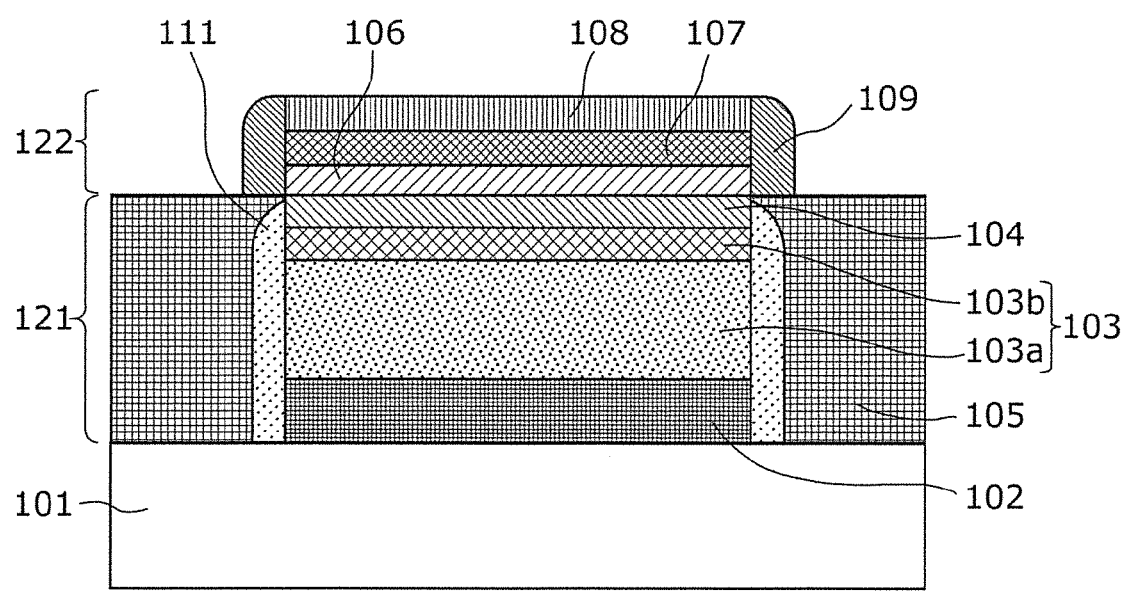
FIG. 1B is a cross-sectional view showing an exemplary configuration of a nonvolatile semiconductor memory element according to variation of Embodiment 1 of the present invention.
Figure 1C:
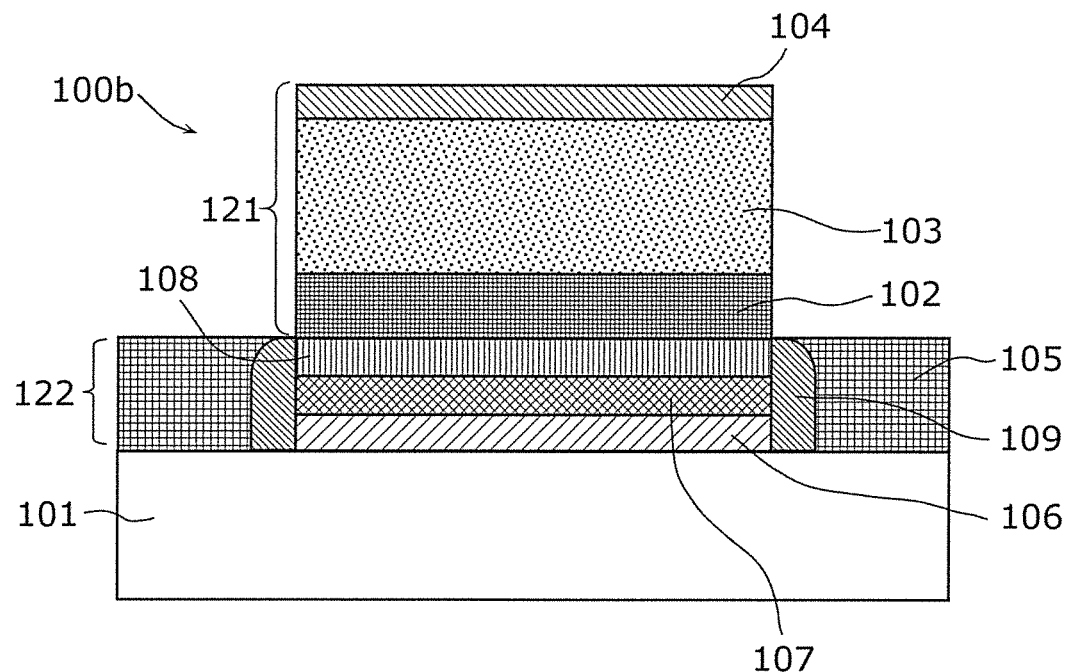
FIG. 1C is a cross-sectional view showing an exemplary configuration of a nonvolatile semiconductor memory element according to another variation of Embodiment 1 of the present invention.
Figure 1D:
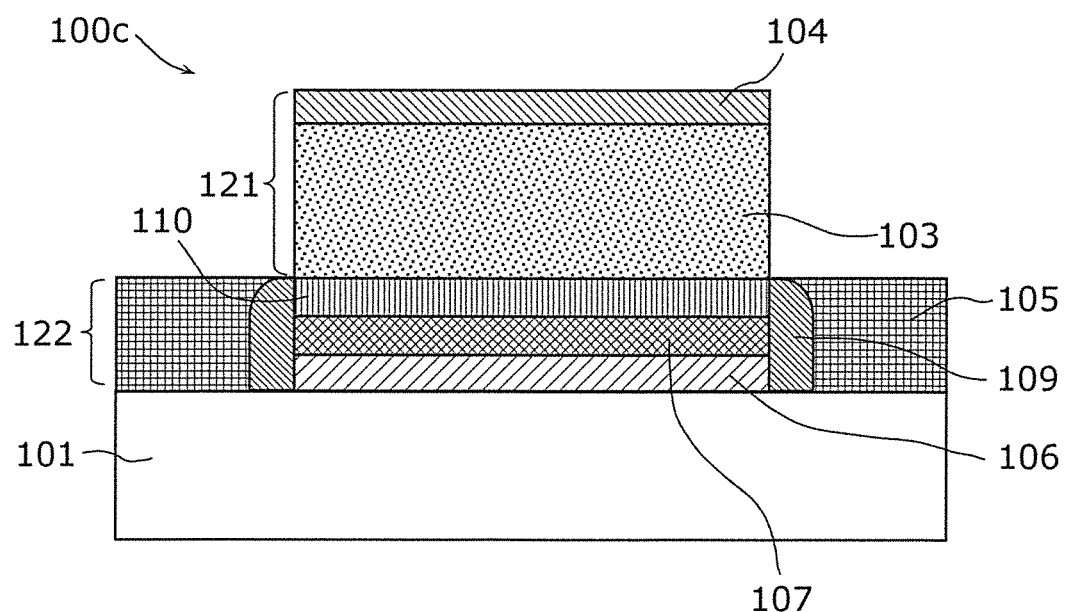
FIG. 1D is a cross-sectional view showing an exemplary configuration of a nonvolatile semiconductor memory element according to another variation of Embodiment 1 of the present invention.
Figure 1E:
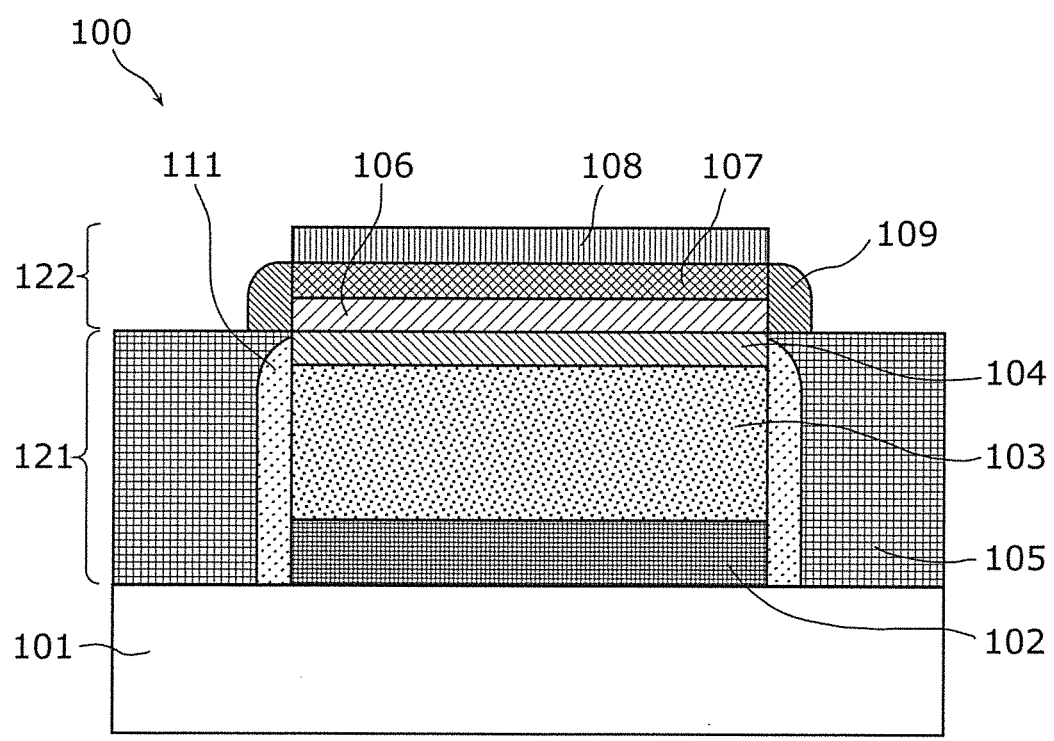
FIG. 1E is a cross-sectional view showing an exemplary configuration of a nonvolatile semiconductor memory element according to another variation of Embodiment 1 of the present invention.

Note that, the structure of the nonvolatile semiconductor memory element according to the present invention is not limited to the structure shown in FIG. 1A, but may be the structures shown in FIG. 1B to FIG. 1D. In a nonvolatile semiconductor memory element 100a shown in FIG. 1B, the variable resistance layer 103 includes a first transition metal oxide layer 103a and a second transition metal oxide layer 103b that are stacked. In this embodiment, as an example, the first transition metal oxide layer 103a includes a first tantalum oxide layer, and the second transition metal oxide layer 103b includes a second tantalum oxide layer. More specifically, the transition metal included in the first transition metal oxide layer 103a and the transition metal included in the second transition metal oxide layer 103b are the same transition metal. Here, an oxygen content atomic percentage of the second tantalum oxide layer is greater than an oxygen content atomic percentage of the first tantalum oxide layer. Stated differently, a degree of oxygen deficiency of the second tantalum oxide layer is smaller than a degree of oxygen deficiency of the first tantalum oxide layer. A degree of oxygen deficiency is a percentage of deficient oxygen with respect to the amount of oxygen included in an oxide having a stoichiometric composition for the respective transition metals. For example, when the transition metal is tantalum (Ta), the oxide having a stoichiometric composition is expressed as $Ta_2O_5$. In this case, an oxygen content atomic percentage (O/(Ta+O)) is 71.4%, and oxygen deficiency is 0%. Thus, an oxygen-deficient tantalum oxide has an oxygen content atomic percentage greater than 0 and smaller than 71.4%. For example, in the case of $TaO_{1.5}$, the degree of oxygen deficiency is (2.5-1.5)/2.5=40%.

It is possible to provide a nonvolatile semiconductor memory element which uses a resistance change phenomenon and has a stable, reversible writing characteristic by using, as the variable resistance layer 103, a stacked structure of the above-described oxygen-deficient first tantalum oxide layer and the second tantalum oxide layer having a greater oxygen content atomic percentage (stated differently, having a smaller degree of oxygen deficiency) than the first tantalum oxide. This is described in detail in International Publication WO 2008/149484 (PTL 4), which is already filed by the Applicant as a related application. In this embodiment, in the case of using a tantalum oxide, it has been verified that the resistance value of the variable resistance layer 103 can be stably changed at high speed when, in the case where the composition of the first tantalum oxide layer used as the first transition metal oxide layer 103a is TaO$_x$, x is at least 0.8 and at most 1.9, and when, in the case where the composition of the second tantalum oxide layer used as the second transition metal oxide layer 103b is TaO$_y$, y is larger than the value of x. In this case, it is preferable that the thickness of the second tantalum oxide layer be in the range of 1 nm to 8 nm. More specifically, the oxygen content atomic percentage of the first tantalum oxide is set to 44 atm % to 66 atm %, and the oxygen content atomic percentage of the second tantalum oxide layer is set to 68 atm % to 71 atm %.

Note that, a transition metal other than tantalum is also usable as a metal included in the variable resistance layer 103. For example, tantalum (Ta), titanium (Ti), hafnium (Hf), zirconium (Zr), niobium (Nb), or tungsten (W) can be used as the transition metal. A transition metal can take a plurality of oxidation states, and thus different resistance states can be realized by an oxidation-reduction reaction. For example, in the case of using a hafnium oxide, it has been verified that the resistance value of the variable resistance layer 103 can be stably changed at high speed when, in the case where the composition of the first hafnium oxide layer used as the first transition metal oxide layer 103a is HfO$_x$, x is at least 0.9 and at most 1.6, and when, in the case where the composition of the second hafnium oxide layer used as the second transition metal oxide layer 103b is HfO$_y$, y is larger than the value of x. In this case, it is preferable that the thickness of the second hafnium oxide layer be in the range of 3 nm to 4 nm. Furthermore, in the case of using a zirconium oxide, it has been verified that the resistance value of the variable resistance layer 103 can be stably changed at high speed when, in the case where the composition of the first zirconium oxide layer used as the first transition metal oxide layer 103a is ZrO$_x$, x is at least 0.9 and at most 1.4, and when, in the case where the composition of the second zirconium oxide layer used as the second transition metal oxide layer 103b is ZrO$_y$, y is larger than the value of x. In this case, it is preferable that the thickness of the second zirconium oxide layer be in the range of 1 nm to 5 nm.

In addition, a first transition metal included in the first transition metal oxide layer 103a may be a different material from a second transition metal included in the second transition metal oxide layer 103b. In this case, it is preferable that the second transition metal oxide layer 103b have smaller degree of oxygen deficiency, that is, have higher resistance than the first transition metal oxide layer 103a. With this configuration, the voltage applied between the first electrode 102 and the second electrode 104 at the time of resistance change is distributed more to the second transition metal oxide layer 103b, and thus the oxidation-reduction reaction which occurs in the second transition metal oxide layer 103b can be more facilitated. Furthermore, when the first transition metal and the second transition metal comprise different materials, it is preferable that the standard electrode potential of the second transition metal be lower than the standard electrode potential of the first transition metal. This is because it is believed that an oxidation-reduction reaction occurs in a small filament (conductive path) formed in the second transition metal oxide layer 103b having high resistance, causing a change in the resistance value of the second transition metal oxide layer 103b, and the resistance changing phenomenon thus occurs. A stable resistance change operation is achieved, for example, when the first transition metal oxide layer 103a comprises an oxygen-deficient tantalum oxide and the second transition metal oxide layer 103b comprises a titanium oxide (TiO$_2$). Titanium (standard electrode potential=−1.63 eV) is a material having a lower standard electrode potential than tantalum (standard electrode potential=−0.6 eV). The higher the standard electrode potential of a material is, the more difficult it is to oxidize the material. When an oxide of a metal having a smaller standard electrode potential than the first transition metal oxide layer 103a is provided in the second transition metal oxide layer 103b, occurrence of the oxidation-reduction reaction is more facilitated in the second transition metal oxide layer 103b.

Furthermore, it is preferable that the second electrode 104 comprise a material, such as platinum (Pt), iridium (Ir), or the like, having a higher standard electrode potential than the transition metal included in the second transition metal oxide layer 103b. The standard electrode potential of platinum and iridium is approximately 1.2 eV. Generally, the standard electrode potential is an index that indicates how easily a material is oxidized. The higher the value is, the less oxidizable a material is, and the lower the value is, the more oxidizable a material is. The greater the difference in the standard electrode potential between the electrode and the variable resistance layer is, the more easily a change in resistance occurs. As the difference becomes smaller, the more difficult it is for a change in resistance to occur. Thus, it can be inferred that a tendency to oxidize plays a large role in the mechanism of the resistance changing phenomenon. The standard electrode potential, which indicates the tendency to oxidize and reduce, of tantalum is −0.6 eV, and is smaller than the standard electrode potential of platinum and iridium. Thus, an oxidation and reduction reaction of the variable resistance layer 103 occurs at the interface between (i) the second electrode 104 comprising platinum or iridium and (ii) the variable resistance layer 103, transfer of oxygen is performed, and a resistance changing phenomenon occurs. With the above, an occurrence of oxidation-reduction reaction is facilitated in the second transition metal oxide layer 103b in the vicinity of the interface between the second electrode 104 and the second transition metal oxide layer 103b, and thus a stable resistance changing phenomenon can be achieved.

Note that, the nonvolatile semiconductor memory element according to this embodiment may have, as shown by a nonvolatile semiconductor memory element 100b in FIG. 1C as another variation of this embodiment, an element structure in which a positional relationship of the variable resistance element 121 and the current steering element 122 are reversed in the vertical direction.

In addition, the nonvolatile semiconductor memory element according to the present invention may have, as shown by a nonvolatile semiconductor memory element 100c in FIG. 1D, a structure in which the second current steering element electrode and the first electrode are formed (as a common electrode 110) using the same material so that both functions are shared in common.

Next, a material included in the current steering element 122 is described. In this embodiment, as each of the first current steering layer 107 and the second current steering layer 109, which is included in the current steering element 122, a nitrogen-deficient silicon nitride film is used, and as each of the first current steering element electrode 106 and the second current steering element electrode 108, tantalum nitride is used. Here, the nitrogen-deficient silicon nitride film refers to a silicon nitride film in which content of nitrogen (atomic ratio: ratio of number of nitrogen atoms to total number of atoms) is smaller than the content of nitrogen in the silicon nitride film having a stoichiometric composition. When the nitrogen-deficient silicon nitride included in the first current steering layer 107 is denoted as SiN$_z$, and the nitrogen-deficient silicon nitride included in the second current steering layer 109 is denoted as SiN$_w$, a relationship z≥w is satisfied.

The nitrogen-deficient silicon nitride film is deposited using, for example, a technique what is called reactive sputtering, that is, a polycrystalline silicon target is sputtered in an atmosphere of mixed gas of argon and nitrogen. Then, typical deposition conditions are pressure in the range of 0.08 Pa to 2 Pa, a substrate temperature in the range of 20 degrees Celsius to 300 degrees Celsius, flow ratio of nitrogen gas (a ratio of nitrogen flow to the total flow of argon and nitrogen) in the range of 0% to 40%, and a DC power in the range of 100 W to 1300 W. Under these conditions, a deposition time is adjusted so that the thickness of the silicon nitride film is 5 nm to 20 nm.

Here, work function of the tantalum nitride is 4.6 eV and is adequately higher than a silicon electron affinity of 3.8 eV. Thus, a Schottky barrier is formed at the interface between the first current steering layer 107 and each of the second current steering layer 109, the first current steering element electrode 106, and second current steering element electrode 108. In this configuration, each of the first current steering element electrode 106 and the second current steering element electrode 108 comprises tantalum nitride, and thus the current steering element 122 functions as a bidirectional metal-semiconductor-metal (MSM) diode.

Figure 2A:
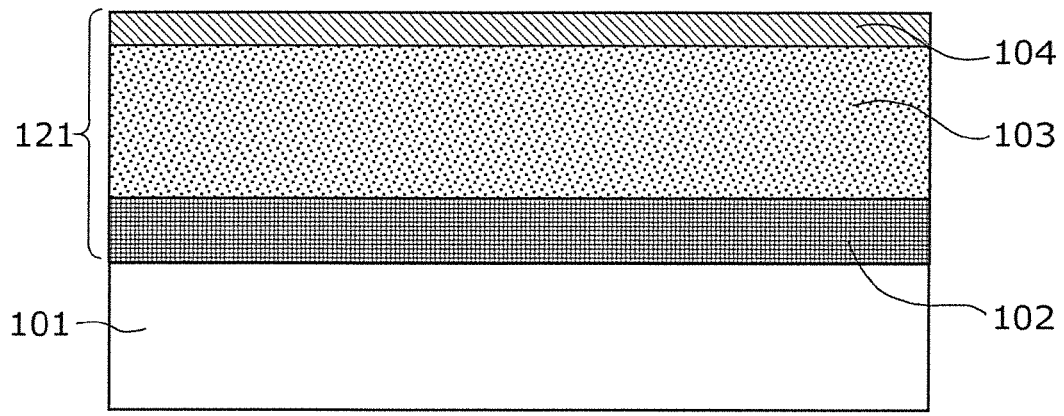
FIG. 2A is a diagram showing a first process (a process of depositing, on a substrate, an electrode and a variable resistance layer included in a variable resistance element) of a method for manufacturing the nonvolatile semiconductor memory element according to Embodiment 1 of the present invention.

Next, a method for manufacturing the nonvolatile semiconductor memory element 100 according to this embodiment having the above-described configuration is described with reference to FIG. 2A to FIG. 2I. First, the first electrode 102, the variable resistance layer 103, and the second electrode 104 are sequentially formed on the substrate 101 (FIG. 2A). For example, TaN is formed as the first electrode 102, an oxygen-deficient tantalum oxide is formed as the variable resistance layer 103, and Ir is formed as the second electrode 104. The film thickness of each of the layers is, for example, as follows. The first electrode 102 has a thickness of 20 nm, the variable resistance layer 103 has a thickness of 30 nm, and the second electrode 104 has a thickness of 30 nm.

Figure 2B:
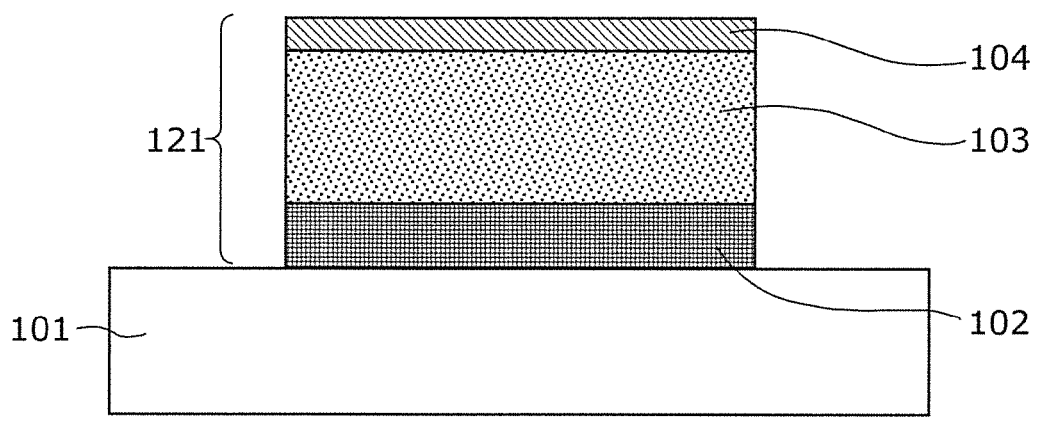
FIG. 2B is a diagram which shows a process subsequent to the process in FIG. 2A and in which a variable resistance element is formed into a desired shape.

Subsequently, patterning by dry etching is performed to form the first electrode 102, the variable resistance layer 103, and the second electrode 104 into a predetermined shape (FIG. 2B).

Figure 2C:
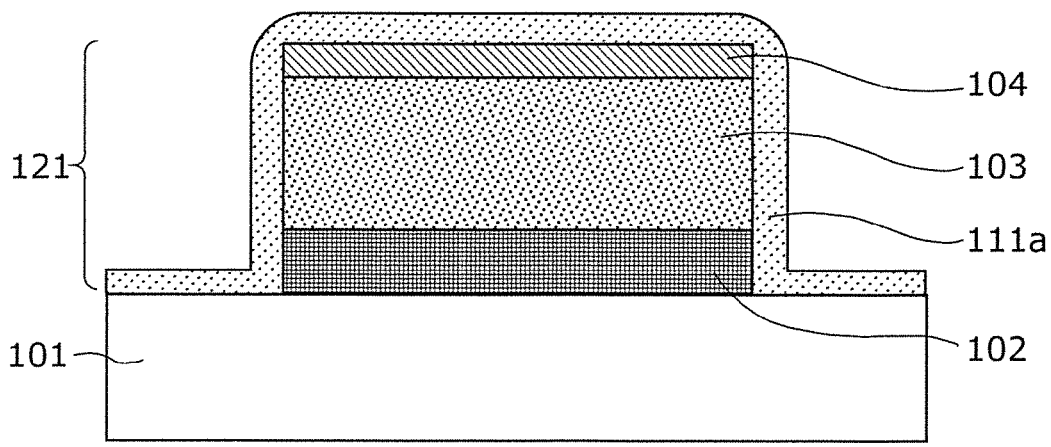
FIG. 2C is a diagram which shows a process subsequent to the process in FIG. 2B and in which a protective layer is formed on the variable resistance element and the substrate.

Subsequently, the protective layer material 111a is deposited on the variable resistance element 121 and the substrate 101. More specifically, $Si_3N_4$ is deposited as the protective layer material 111a by reactive sputtering. The film thickness of the protective layer material 111a is 200 nm, for example. At this time, for example, a polycrystalline silicon target is used. A typical deposition conditions are pressure in the range of 0.08 Pa to 2 Pa, a substrate temperature in the range of 20 degrees Celsius to 300 degrees Celsius, flow ratio of nitrogen gas (a ratio of nitrogen flow to the total flow of argon and nitrogen) in the range of 67% to 90%, and a DC power in the range of 100 W to 1300 W (FIG. 2C).

Figure 2D:
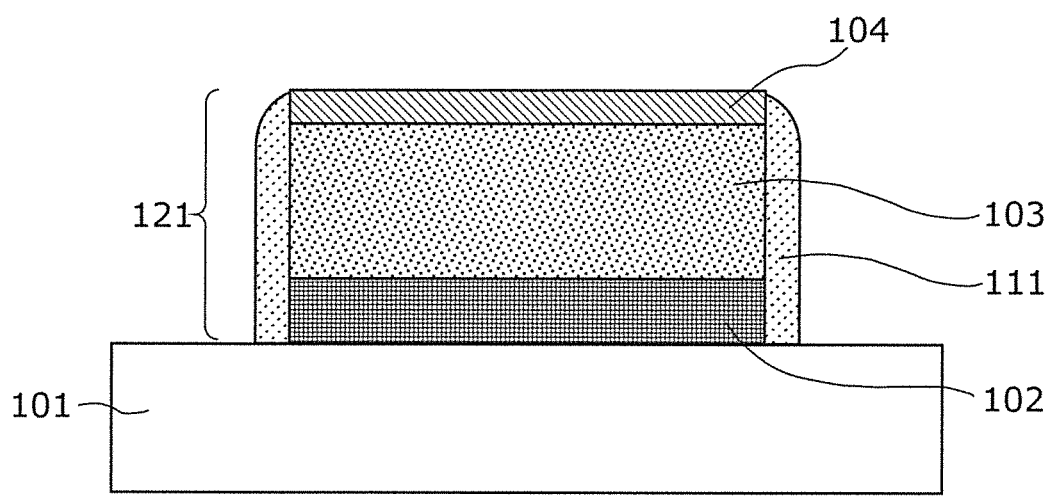
FIG. 2D is a diagram which shows a process subsequent to the process in FIG. 2C and in which the protective layer is formed only on the end surface of the variable resistance element to have a side wall shape by etch back.

After this, an unnecessary protective layer material 111a is removed by etch back to form a protective layer 111 on a side end surface of the variable resistance element 121 (FIG. 2D).

Figure 2E:
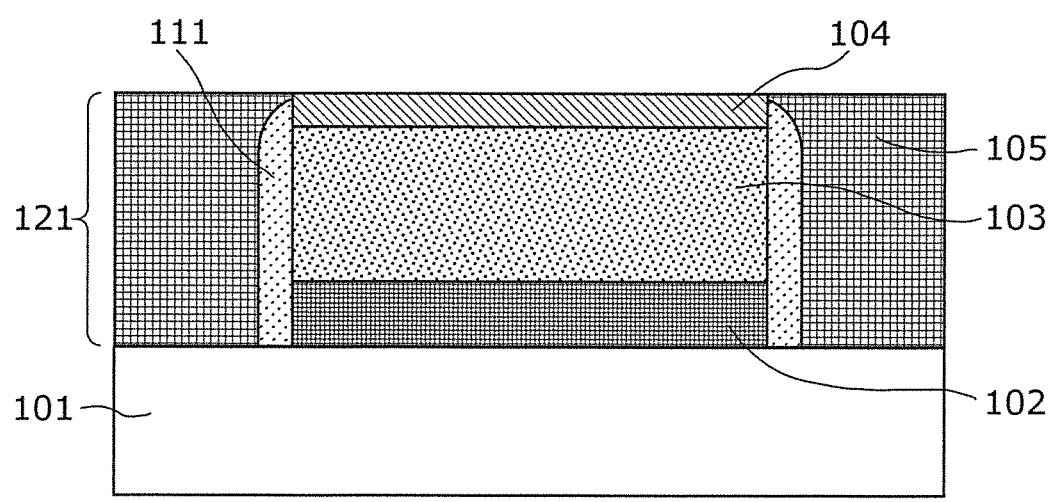
FIG. 2E is a diagram which shows a process subsequent to the process in FIG. 2D and in which an interlayer dielectric is formed.

After this, the interlayer dielectric 105 is formed to cover (i) a top surface of the substrate 101 and (ii) a side surface of each of the first electrode 102, the variable resistance layer 103, and the second electrode 104 through a protective layer 111. In addition, polishing through a chemical mechanical polishing (CMP) process is performed so that the top surface of the second electrode 104 is in line with the top surface of the interlayer dielectric (FIG. 2E). For example, silicon oxide can be used as the interlayer dielectric 105. The introduction of the protective layer 111 makes it possible to prevent shorting of the variable resistance element 121 even when (i) the polishing is somewhat excessively performed resulting in an exposure of an end surface of the variable resistance layer 103 or (ii) the first current steering element electrode 106 is formed in the next process shown in FIG. 2F.

Figure 2F:
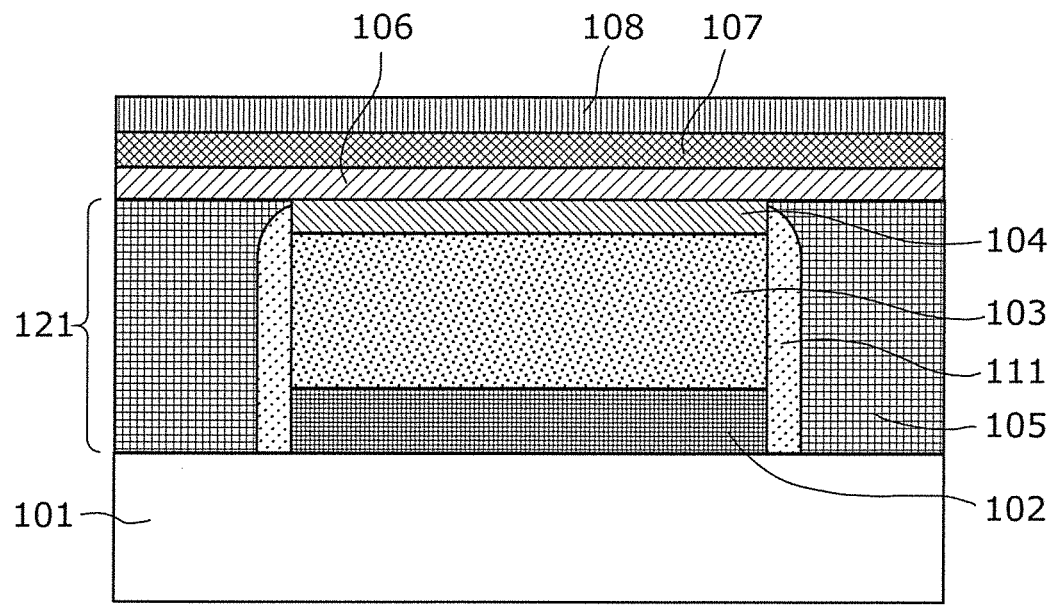
FIG. 2F is a diagram which shows a process subsequent to the process in FIG. 2E and in which an electrode and a first current steering layer included in a current steering element are formed.

Next, the first current steering element electrode 106, the first current steering layer 107, and the second current steering element electrode 108 are sequentially formed on the interlayer dielectric 105 and the second electrode 104 (FIG. 2F). Each of the first current steering element electrode 106 and the second current steering element electrode 108 is, for example, a tantalum nitride film having a thickness of 20 nm formed by reactive sputtering. As the first current steering layer 107, a nitrogen-deficient silicon nitride film is formed using a reactive sputtering method. The thickness of the first current steering layer 107 is, for example, in the range of 5 nm to 20 nm.

Figure 2G:
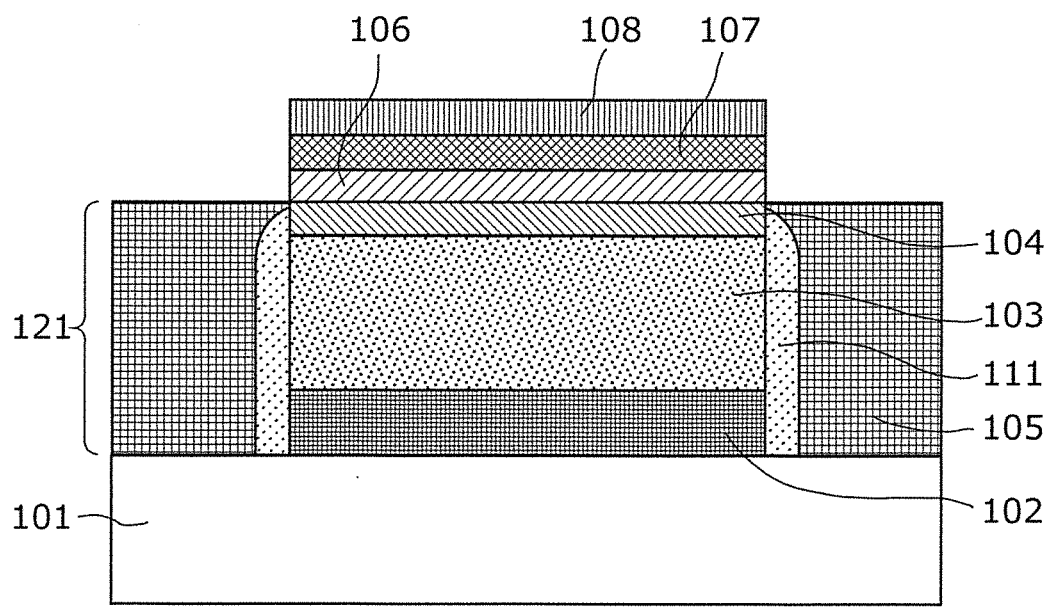
FIG. 2G is a diagram which shows a process subsequent to the process in FIG. 2F and in which the current steering element is formed into a desired shape.

In addition, the first current steering element electrode 106, the first current steering layer 107, and the second current steering element electrode 108 are formed into a desired shape through dry etching process (FIG. 2G).

Figure 2H:
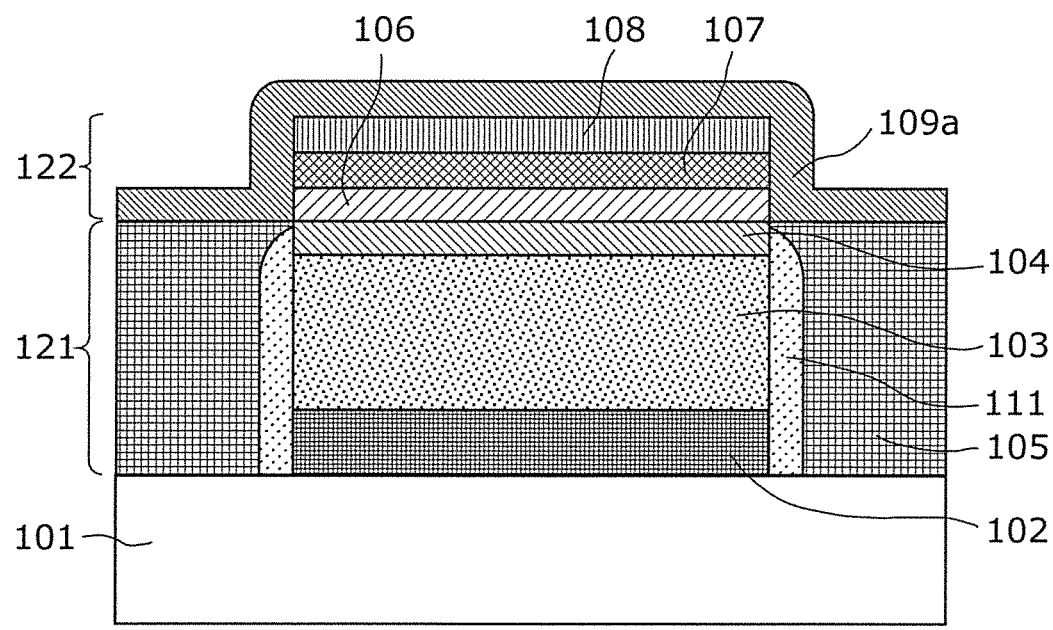
FIG. 2H is a diagram which shows a process subsequent to the process in FIG. 2G and in which a second current steering layer material is formed.

Subsequently, a nitrogen-deficient silicon nitride film 109a included in the second current steering layer 109 is deposited on an entire surface of an element (more specifically, on a top surface that is exposed) (FIG. 2H). The thickness of the nitrogen-deficient silicon nitride film 109a is, for example, 20 nm.

Figure 2I:
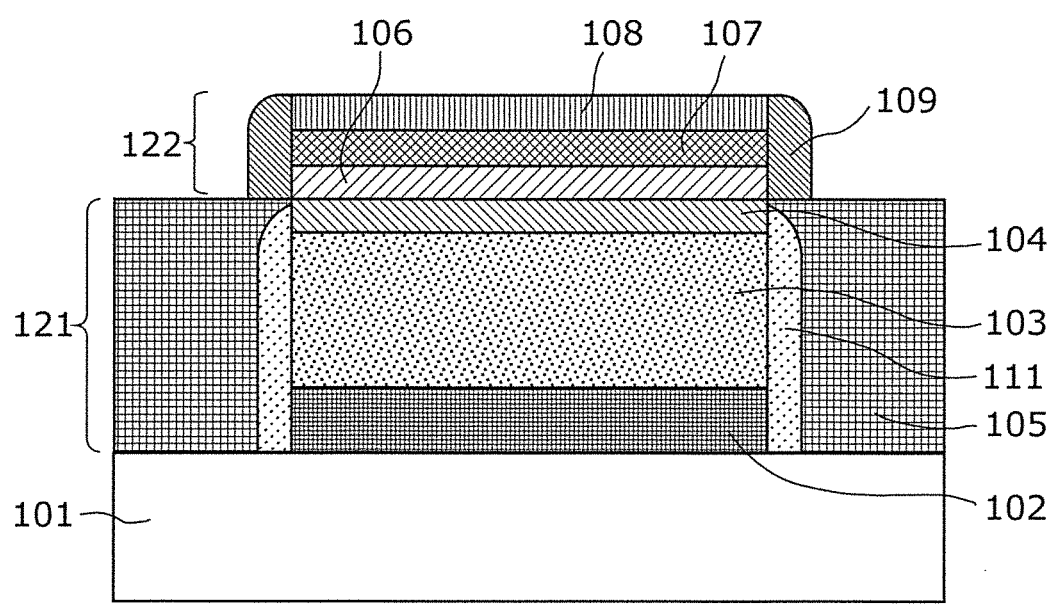
FIG. 2I is a diagram which shows a process subsequent to the process in FIG. 2H and in which a second current steering layer is formed.

Lastly, unnecessary portion of the second current steering layer 109 is removed through an anisotropic etching process. Thus, the second current steering layer 109 which (i) covers a side surface of each of the first current steering element electrode 106, the first current steering layer 107, and the second current steering element electrode 108 and (ii) is connected to a side surface of each of the first current steering element electrode 106, the first current steering layer 107, and the second current steering element electrode 108 is formed (FIG. 2I).

In the nonvolatile semiconductor memory element 100 according to this embodiment that is manufactured according to the above-described manufacturing method, the bidirectional current steering element 122 included in the nonvolatile semiconductor memory element 100 has a structure including the second current steering layer 109 which covers a side surface of each of the first current steering element electrode 106, the first current steering layer 107, and the second current steering element electrode 108. Thus, it is possible to increase an effective area (a cross-sectional area of the path through which a current flows) of the current steering element 122 to be larger than an effective area of the variable resistance element 121. Thus, in the nonvolatile semiconductor memory element 100 according to this embodiment, it is possible to increase a current (on-current) in a state in which an application voltage is high (on-state). In particular, it becomes possible to provide a current (on-current) even when an element is miniaturized. With this, even when density of nonvolatile semiconductor memory elements included in the nonvolatile semiconductor memory device is increased, a stable operation is achieved.

Figure 3:
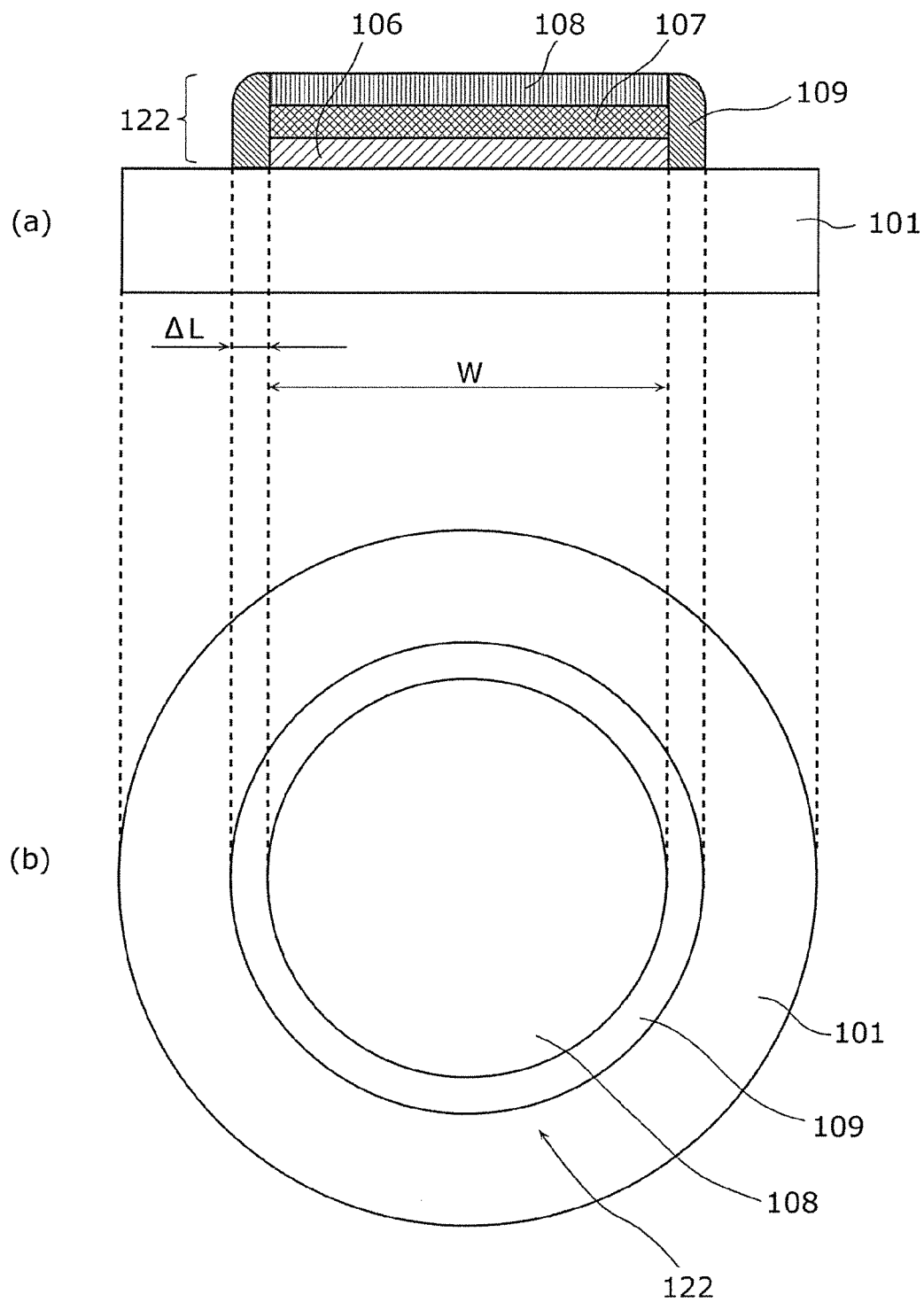
FIG. 3 is a diagram of a current steering element used for evaluating a characteristic in Embodiment 1 of the present invention. (a) in FIG. 3 shows a cross-sectional view of the current steering element, and (b) in FIG. 3 is a top view of the current steering element.

Next, characteristics of the bidirectional current steering element 122 according to this embodiment are described. Note that, in this embodiment, characteristics of the current steering element 122 are obtained using the current steering element 122 which is shown in FIG. 3 and has a structure that includes only the current steering element 122 provided on the substrate 101 of the nonvolatile semiconductor memory element 100. (a) and (b) in FIG. 3 are respectively a cross-sectional view and a top view of the current steering element 122 for evaluation.

Here, the current steering element 122 for evaluation, that is, the current steering element including the second current steering layer 109 that is provided on the side end surface of each of the first current steering element electrode 106, the first current steering layer 107, and the second current steering element electrode 108 is evaluated for an I-V (current-voltage) characteristic. An $SiN_{0.3}$ film having a thickness of 20 nm is used as each of the first current steering layer 107 and the second current steering layer 109, a TaN film having a thickness of 20 nm is used as the first current steering element electrode 106, and a TaN film having a thickness of 50 nm is used as the second current steering element electrode 108.

Figure 4:
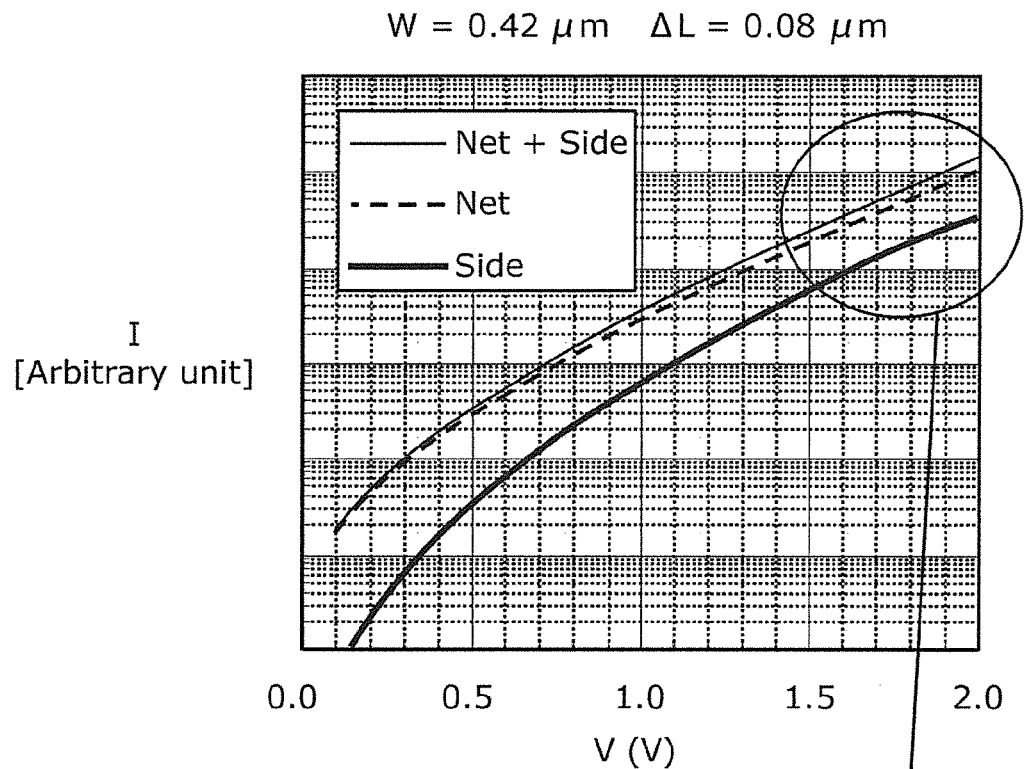
FIG. 4 is a diagram showing a relationship of a current-voltage characteristic of the current steering element, according to Embodiment 1, calculated using a computation simulation.
Figure 4:
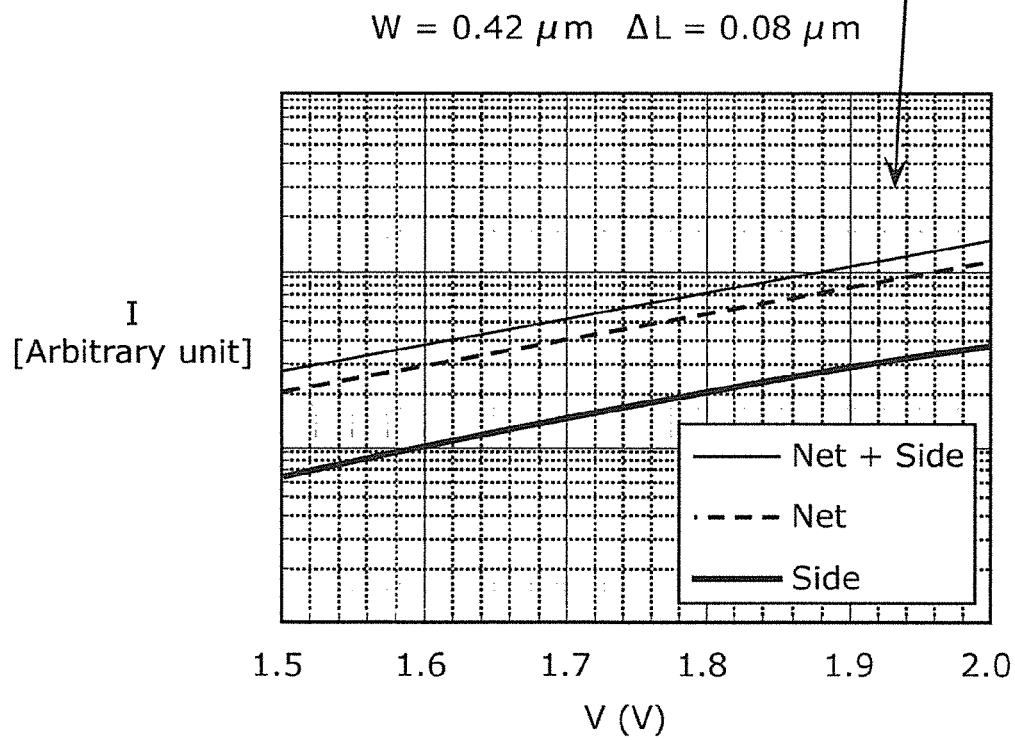

FIG. 4 is a diagram showing current-voltage characteristics of the current steering element 122, according to the present invention, calculated using a computation simulation using the above-described current steering element 122 for evaluation. Here, in the case of the bidirectional current steering element 122, a voltage-current characteristic with respect to the direction in which the voltage is applied is symmetrical. Thus, the diagram only shows the results when the voltage is applied in the positive direction. Note that, in the computation simulation, as shown in FIG. 3, the calculation is performed on the case in which the diameter W of the first current steering layer 107 is 0.42 µm and the thickness ΔL of the second current steering layer 109 is 0.08 µm. FIG. 4 shows a calculated value of a current ($I_{Net}$) that flows only in the first current steering layer 107, a calculated value of a current ($I_{Side}$) that flows only in the second current steering layer 109 (i.e., a side wall part), and the result of their sum ($I_{Net}+_{Side}$). Note that, in FIG. 4, the vertical axis is a logarithmic representation of a current (I) indicated in an arbitrary unit.

As shown in FIG. 4, in an on region 1.5 V to 2 V, $I_{Side}$ is approximately ⅓ of the value of $I_{Net}$, and the second current steering layer 109 has advantageous effects in providing an on-current. In addition, $I_{Side}$ decreases steeply in an off-region (0 V to 0.5 V). Thus, improvement of $I_{ON}/I_{OFF}$ ratio, namely, a ratio of current value in an on-region and a current value in an off-region of the current steering element 122, which has a structure including the second current steering layer 109 that is provided on its end surface as described in this embodiment, is also expected. According to the results in FIG. 4, a current ratio: $I_{ON}/I_{OFF}$ ratio calculated from the current values of the current steering element 122, which includes the second current steering layer 109, at 2 V and at 0.3 V is 1450. On the other hand, a current ratio: $I_{ON}/I_{OFF}$ ratio that is a ratio of current values $I_{Net}$ of the current steering element, which does not include the second current steering layer 109, at 2 V and at 0.3 V is 1167. This indicates that provision of the second current steering layer 109 improves $I_{ON}/I_{OFF}$ ratio by 24%.

Figure 5:
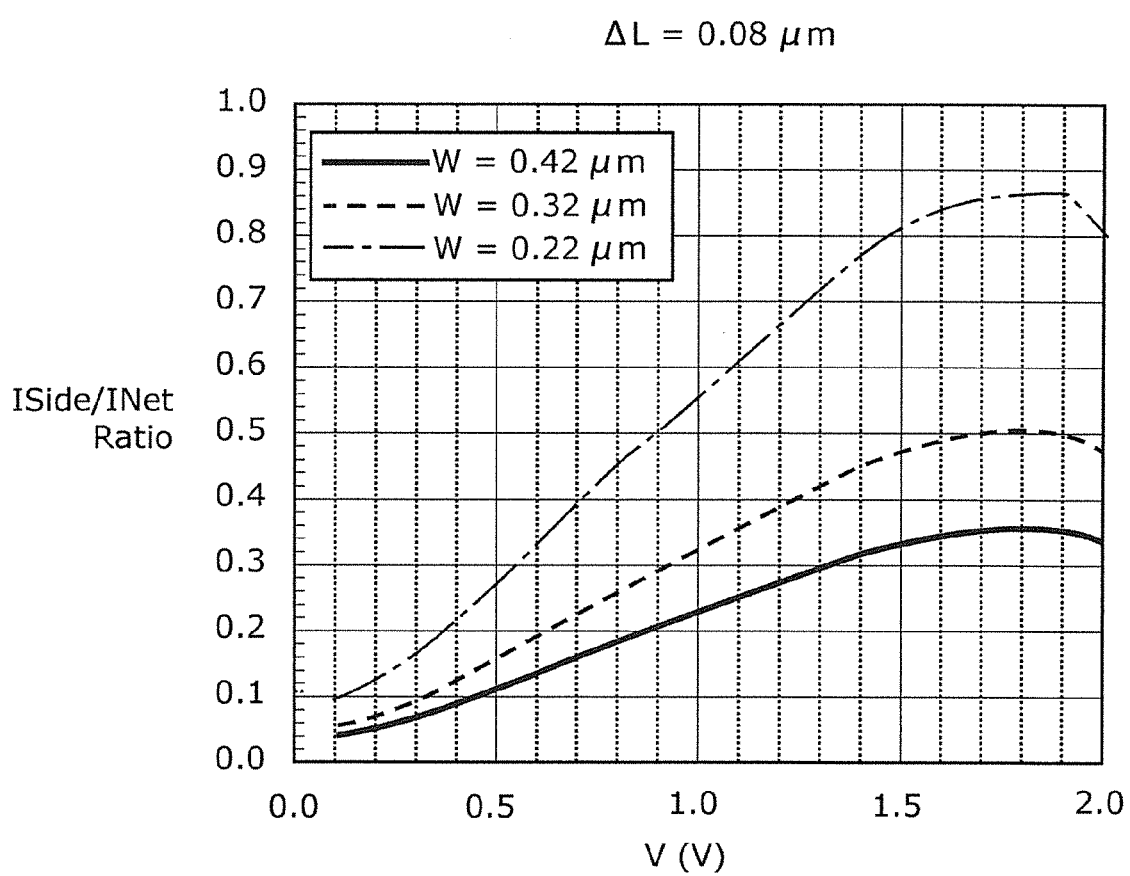
FIG. 5 is a diagram showing an element size dependency of $I_{Side}/I_{Net}$ current ratio of the current steering element, according to Embodiment 1, calculated using a computation simulation.

Furthermore, dependency of $I_{Side}/I_{Net}$ current ratio on an element size (a diameter W of the first current steering layer 107) is calculated. FIG. 5 shows the results. When the thickness ΔL of the second current steering layer 109 is constant and is 0.08 µm, it is inferred that $I_{Side}/I_{Net}$ current ratio increases with the decrease in an element size W. Moreover, when W=0.22 µm, $I_{Side}/I_{Net}$ current ratio at V=1.9 V, which is on-region, is 0.87 and is a significantly high value. The more miniaturized the element is, the more important a current value of the second current steering layer 109 becomes.

Figure 6:
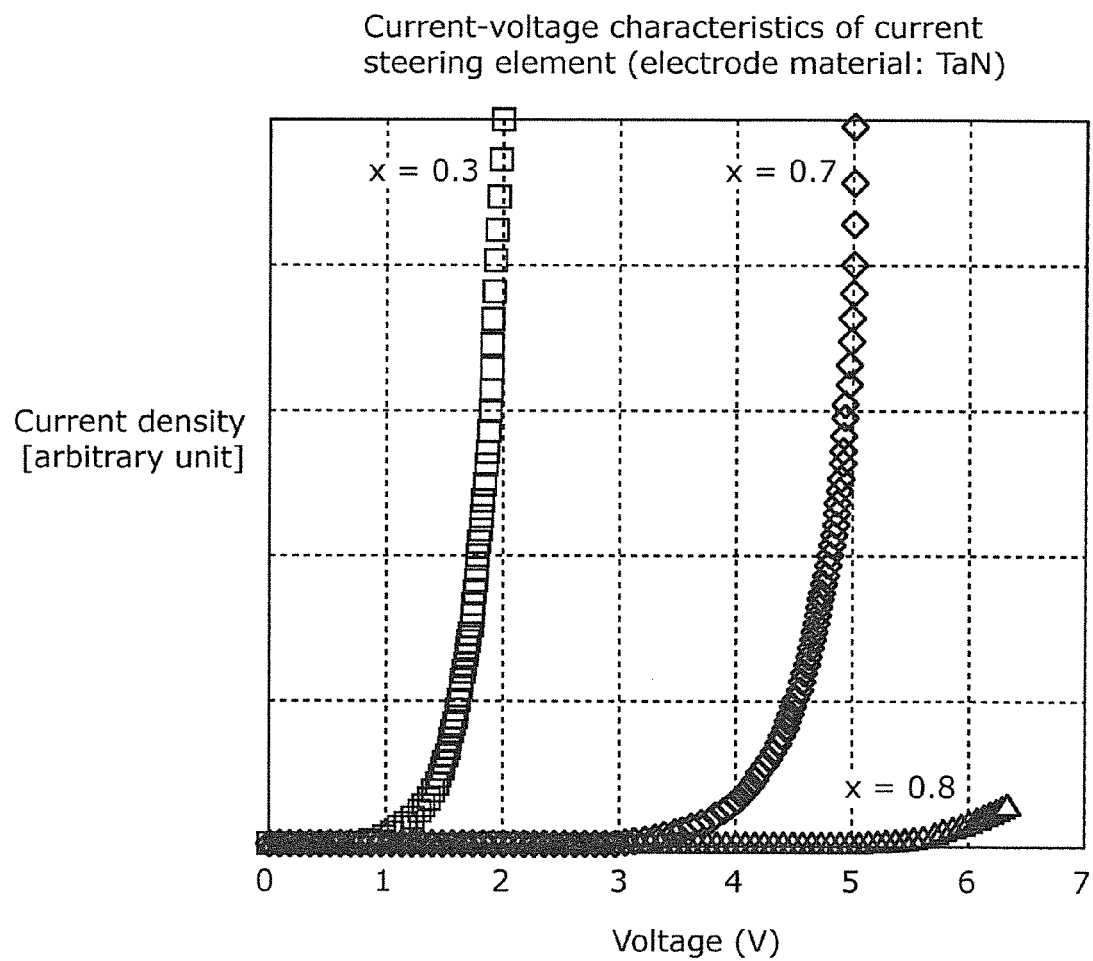
FIG. 6 is a diagram showing composition dependency of a current-voltage characteristic of a semiconductor layer included in the current steering element.

In addition, I-V characteristics of the current steering element 122 depend on a composition of a nitrogen-deficient silicon nitride film. FIG. 6 shows evaluation results of I (current)-V (voltage) characteristics of a current steering element including a pair of electrodes including TaN and a semiconductor layer which comprises $SiN_x$ and has a thickness of 10 nm. FIG. 6 shows the case of x=0.3, 0.7, and 0.8. Furthermore, in FIG. 6, I-V characteristics of the case in which the polarity of an application voltage is negative is omitted for convenience. The vertical axis is a linear representation of current density in an arbitrary unit. As shown in FIG. 6, changing nitrogen composition x from 0.3 to 0.7 increases the voltage, at which a conduction state is achieved, approximately by 3 V. $SiN_x$ having a lower nitrogen content atomic percentage becomes conductive at a lower voltage. Thus, it is inferred that a larger current flows when a nitrogen content atomic percentage: w of a nitrogen-deficient silicon nitride film (denoted as $SiN_w$) that is a second current steering layer included in the second current steering layer 109 of the current steering element is smaller than a nitrogen content atomic percentage: z of a first current steering layer (denoted as $SiN_z$). Thus, when the current steering element is miniaturized, an adequate on-current can be provided by decreasing a nitrogen content atomic percentage of the second current steering layer.

The above indicates that, in the case of a bidirectional current steering element 122 in this embodiment, an adequate on-current can also be provided even in the current steering element 122 that is small.

Note that, although the variable resistance element 121 described in this embodiment has a structure in which metal electrodes are provided on the top side and the bottom side of the transition metal oxide layer, the present invention is not limited to such a configuration. For example, as the variable resistance element, a variable resistance element used in a phase change memory, a magnetic tunnel junction (MTJ) used in magnetoresistive random access memory (MRAM), or the like may be used.

Furthermore, in the nonvolatile semiconductor memory element 100 according to this embodiment, it is described that the first electrode 102 is TaN and the second electrode 104 is Ir. However, it is also possible to use Ir as the first electrode 102, and use TaN as the second electrode 104. In this case, the first current steering element electrode 106 and the second electrode 104 can be used in common.

Note that, this embodiment described the structure in which the current steering element 122 is formed on the variable resistance element 121. However, it is apparent that the present invention is also effective for the structure in which the variable resistance element 121 is formed on the current steering element 122.

Furthermore, the variable resistance element 121 according to this embodiment includes, on its side end surface, the protective layer 111. With this, the oxidization of the variable resistance layer 103, which comprises an oxygen-deficient metal oxide, at the time of formation of the interlayer dielectric 105 can be reduced. The present invention is effective in this regard.

Embodiment 2

Figure 7A:
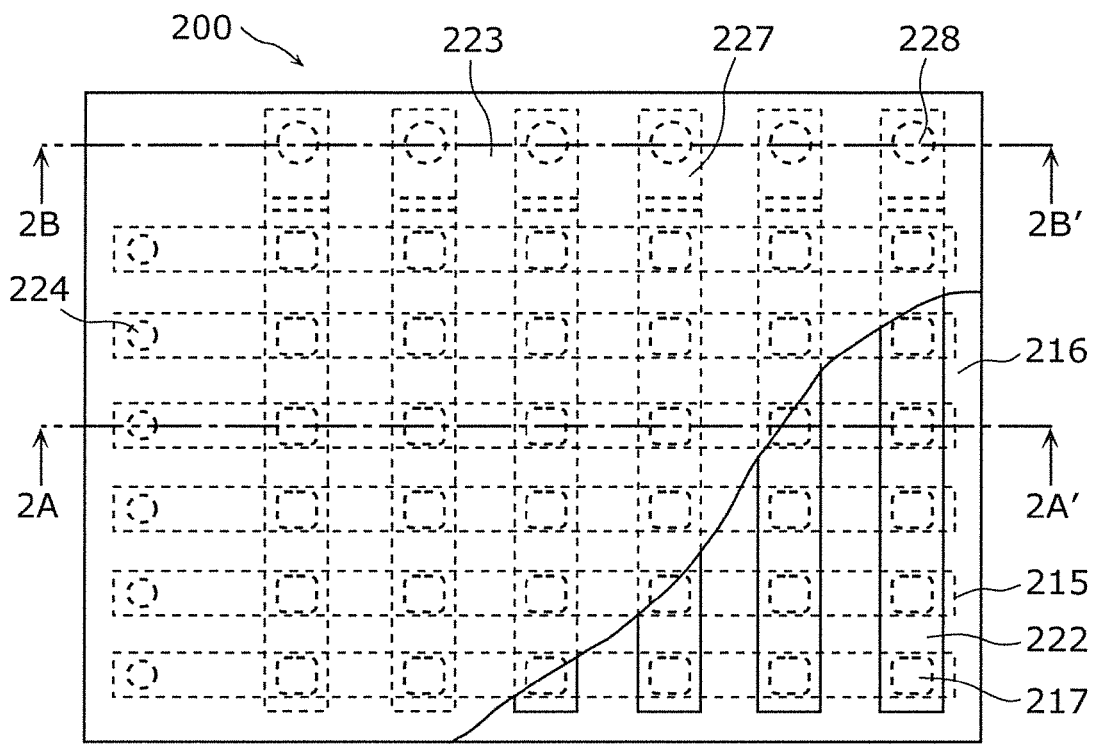
FIG. 7A is a plan view of a nonvolatile semiconductor memory device according to Embodiment 2.
Figure 7B:
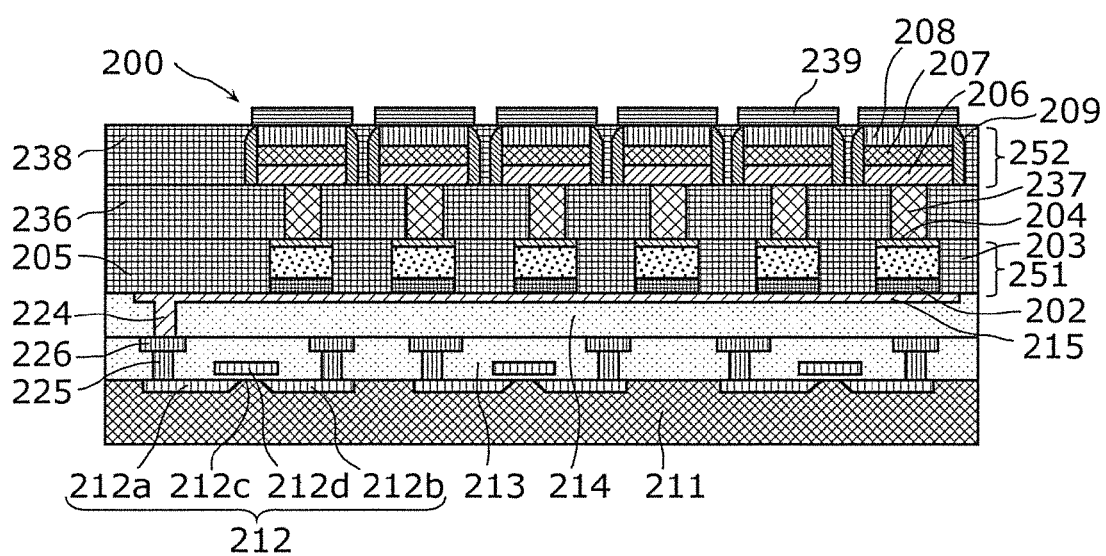
FIG. 7B is a cross-sectional view taken along line 2A-2A' shown in FIG. 7A.
Figure 7C:
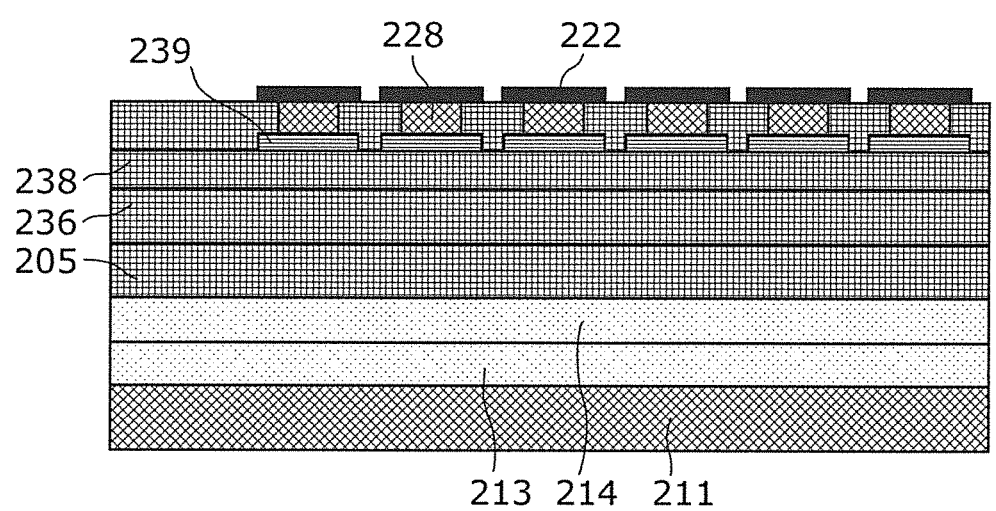
FIG. 7C is a cross-sectional view taken along line 2B-2B' shown in FIG. 7A.

Each of FIG. 7A to FIG. 7C is a cross-sectional view for describing a configuration of a nonvolatile semiconductor memory device 200 according to Embodiment 2 of the present invention. The nonvolatile semiconductor memory device 200 has a configuration (memory cell array) in which a plurality of nonvolatile semiconductor memory elements 100 according to Embodiment 1 are arranged in a matrix. However, a variable resistance element 251 and a current steering element 252 included in the nonvolatile semiconductor memory element 100 are connected to each other through an embedded conductor 237, which is a point different from the nonvolatile semiconductor memory element 100 according to Embodiment 1. Note that, in the plan view shown in FIG. 7A, an insulating protective layer (first interlayer dielectric) 223 which is the uppermost layer is partially cut out for ease of comprehension. FIG. 7B is a cross-sectional view as viewed from the direction of the arrow along the line 2A-2A' in FIG. 7A. Note that, in FIG. 7B, illustration of the insulating protective layer (first interlayer dielectric) 223 shown in FIG. 7A is omitted. FIG. 7C is a cross-sectional view taken along line 2B-2B' shown in FIG. 7A.

The nonvolatile semiconductor memory device 200 according to this embodiment includes: a substrate 211; lower electrode lines 215 which are formed on the substrate 211 and are in a stripe pattern; an interlayer dielectric 205 provided, on the substrate 211 including the lower electrode lines 215, on the lower electrode lines 215; a plurality of the variable resistance elements 251 connected to the lower electrode lines 215; and a plurality of the current steering elements 252 which are formed above the variable resistance elements 251, and each of which is connected to a corresponding one of the variable resistance elements 251 through the embedded conductor 237.

In addition, each of the current steering elements 252 is a bidirectional current steering element having a stacked structure of three layers, namely, a first current steering element electrode 206 that is a metal electrode assembly layer and is in a plane shape, a second current steering element electrode 208 that is a metal electrode assembly layer and is in a plane shape, and a first current steering layer 207 in a plane shape, and including a second current steering layer 209 that covers side surfaces of these three layers. Note that, in Embodiment 2 as well, it is also acceptable that the second current steering layer 209 cover the side surface of the first current steering layer 207, and at least a portion of a side surface of the first current steering element electrode 206 and the second current steering element electrode 208, instead of entirely covering a side surface of each of the first current steering element electrode 206, the second current steering element electrode 208, and the first current steering layer 207.

In addition, in this embodiment, upper electrodes 222 are formed, on a third interlayer dielectric 238, in a stripe pattern and three-dimensionally cross the lower electrode lines 215.

Furthermore, each of the variable resistance elements 251 includes a first electrode 202, a variable resistance layer 203, and a second electrode 204. As the variable resistance layer 203, for example, an oxygen-deficient tantalum oxide such as $TaO_x$ ($0<x<2.5$) is preferable in terms of stability of the variable resistance characteristic and reproducibility for manufacturing. An oxygen-deficient $TaO_x$ can be produced using a reactive sputtering method, for example. At this time, the oxygen content atomic percentage of the variable resistance layer 203 can be controlled by adjusting the flow rate of oxygen in the sputtering gas.

Note that, as shown in FIG. 7A, the lower layer electrode lines 215 and the upper electrodes 222 extend to outside of a region (a storage unit 217) in which the variable resistance elements 251 and the current steering elements 252 are formed in a matrix. Furthermore, as shown in FIG. 7C, the upper electrodes 222 are connected to upper layer electrode lines 239 through embedded conductors 228 outside the matrix region. Furthermore, the upper electrodes 222 also function as upper layer electrode lines in the matrix region.

Furthermore, in this embodiment, a silicon single crystal substrate is used as the substrate 211. The substrate 211 includes a semiconductor circuit in which active elements 212, such as a transistor, are integrated. FIG. 7B shows, as the active elements 212, transistors each of which includes a source region 212a, a drain region 212b, a gate dielectric 212c, and a gate electrode 212d. However, the active element 212 includes not only a transistor, but includes an element, such as a DRAM, which is generally necessary for a memory circuit.

The lower layer electrode lines 215 and the upper layer electrode lines 239 are connected to the active elements 212 in a region different from the matrix region in which the variable resistance elements 251 and the current steering elements 252 are formed. Specifically, in FIG. 7B, the lower layer electrode lines 215 are connected, through embedded conductors 224 and 225 and an electrode line 226, to a source region 212a of the active element 212. Furthermore, likewise, the upper layer electrode line 239 is also connected to a different active element (not shown) through an embedded conductor (not shown).

The lower layer electrode line 215 can be easily formed, for example, by depositing a film using a sputtering method using a Ti—Al—N alloy, Cu, or Al, and performing a photolithography process and an etching process. Furthermore, the variable resistance layer 203 included in the variable resistance element 251 is not limited to the above-described tantalum oxide, but may comprise a transition metal oxide, such as a titanium oxide, a vanadium oxide, a cobalt oxide, a nickel oxide, a zinc oxide, or a niobium oxide film. Furthermore, such transition metal oxides may be formed using a CVD method or an ALD method. Such a transition metal oxide material exhibits a specific resistance value when a voltage or a current equal to or larger than a threshold is applied, and maintains the specific resistance value until a pulse voltage or a pulse current having a certain value is newly applied.

Furthermore, an insulating oxide material can be used as the interlayer dielectric 205. Specifically, a silicon oxide (SiO) formed using a chemical vapor deposition (CVD) method, a TEOS-SiO film formed using the CVD method using ozone ($O_3$) and tetraethoxysilane (TEOS), a silicon nitride (SiN) film, or the like may be used. Furthermore, a silicon carbon nitride (SiCN) film, a silicon oxycarbide (SiOC) film, a fluorinated silicon oxide (SiOF) film, or the like which are low-permittivity materials may be used.

The current steering element 252 has a configuration similar to the configuration according to Embodiment 1. In other words, each of the first current steering element electrode 206 and the second current steering element electrode 208 comprises tantalum nitride, and each of the first current steering layer 207 and the second current steering layer 209 includes a nitrogen-deficient silicon nitride film.

Next, a method for manufacturing the nonvolatile semiconductor memory device 200 according to this embodiment is described with reference to FIG. 8A to FIG. 8L.

Figure 8A:
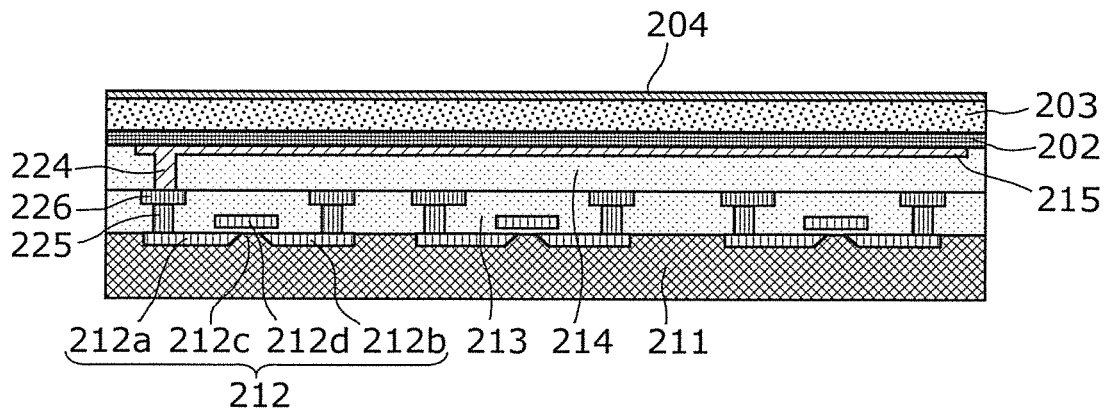
FIG. 8A is a cross-sectional view (a cross-sectional view of a state in which a first electrode, a variable resistance layer, and a second electrode are formed on a substrate including an active element) of a nonvolatile semiconductor memory device in a first process of a method for manufacturing a nonvolatile semiconductor memory device according to Embodiment 2.

FIG. 8A is a cross-sectional view showing a state in which the first electrode 202, the variable resistance layer 203, and the second electrode 204 are formed on the substrate 211 including the active element 212. First, as shown in FIG. 8A, the lower layer electrode line 215 is formed on the substrate 211 on which a plurality of the active elements 212, the electrode line 226, interlayer dielectrics 213 and 214 are formed. The electrode line 226 conventionally most often comprises aluminum. However, lately, the electrode line 226 most often comprises copper that can realize a low resistance even when miniaturized. Furthermore, in order to reduce the parasitic capacitance between the lines, each of the interlayer dielectrics 213 and 214 comprises a fluorine-containing oxide (e.g., SiOF), a carbon-containing nitride (e.g., SiCN), or an organic resin material (e.g., polyimide). In this embodiment as well, for example, copper can be used as the electrode line 226, and, for example, SiOF that is a fluorine-containing oxide can be used as each of the interlayer dielectrics 213 and 214.

Note that, the lower layer electrode lines 215 are embedded in the interlayer dielectric 214, which can be formed as follows. Specifically, in the interlayer dielectric 214, grooves in a stripe pattern for embedding the lower electrode lines 215, and a contact hole for connecting the lower electrode lines 215 to the electrode line 226 are formed. These can be easily formed using a technique used in an ordinary semiconductor manufacturing process. After forming such a groove and a contact hole, a conductive film that will be formed into the lower layer electrode lines 215 is formed, and then, for example, a CMP is performed. The lower electrode lines 215 having a shape shown in FIG. 8A can be thus formed. Note that, the lower layer electrode lines 215 are not limited to the above-described Ti—Al—N alloy material but may comprise, for example, Cu, Al, Ti—Al alloy, or a stacked structure thereof.

Figure 8B:
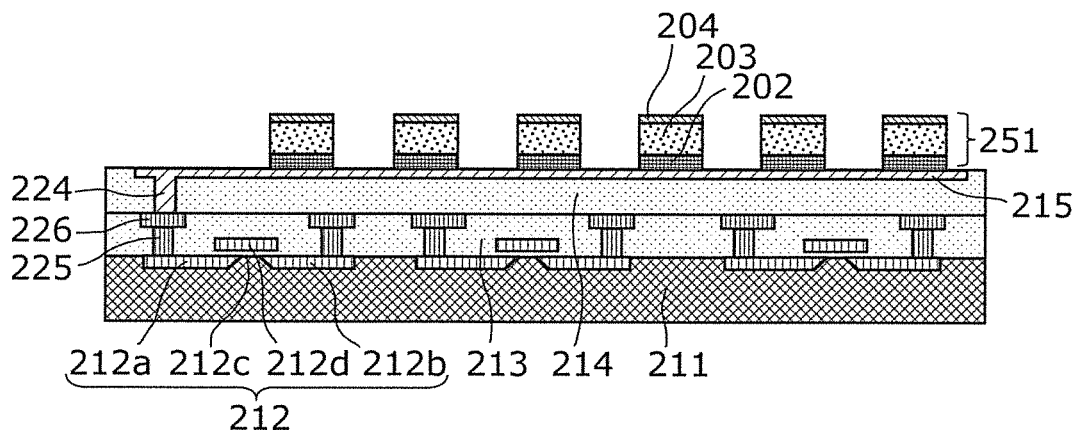
FIG. 8B is a cross-sectional view (a cross-sectional view of a state in which a formation into a desired shape is performed to form a variable resistance element) of the nonvolatile semiconductor memory device in a process subsequent to the process shown in FIG. 8A.

Next, the first electrode 202, the variable resistance layer 203, and the second electrode 204 are formed using, for example, a sputtering method on the substrate 211 including the lower layer electrode lines 215. For example, TaN is formed as the first electrode 202, an oxygen-deficient tantalum oxide ($TaO_x$) is formed as the variable resistance layer 203, and Ir is formed as the second electrode 204. An example of a thickness of each of the layers is as follows. The first electrode 202 has a thickness of 20 nm, the variable resistance layer 203 has a thickness of 30 nm, and the second electrode 204 has a thickness of 30 nm. In this embodiment, $TaO_x$ is deposited, using a reactive sputtering method, as the variable resistance layer 203. Such a $TaO_x$ film may be produced in an oxygen gas atmosphere using a Ta target, for example, at a room temperature condition, with the pressure of a chamber in the range of 0.03 Pa to 3 Pa, and the $Ar/O_2$ flow rate in the range of 20 sccm/5 sccm to 20 sccm/30 sccm. Note that, the method for depositing a film is not limited to the sputtering method, but a CVD method or an atomic layer deposition (ALD) method may be used. After this, as shown in FIG. 8B, the variable resistance element 251 is formed by forming the first electrode 202, the variable resistance layer 203, and the second electrode 204 into a desired shape through a process, such as dry etching.

Figure 8C:
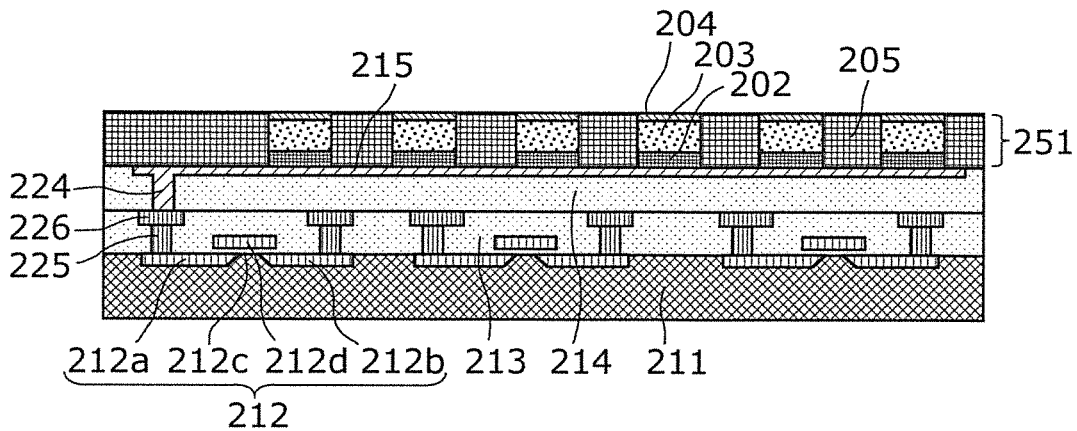
FIG. 8C is a cross-sectional view (a cross-sectional view of a state in which an interlayer dielectric is formed other than on a variable resistance element) of the nonvolatile semiconductor memory device in a process subsequent to the process shown in FIG. 8B.
Figure 8D:
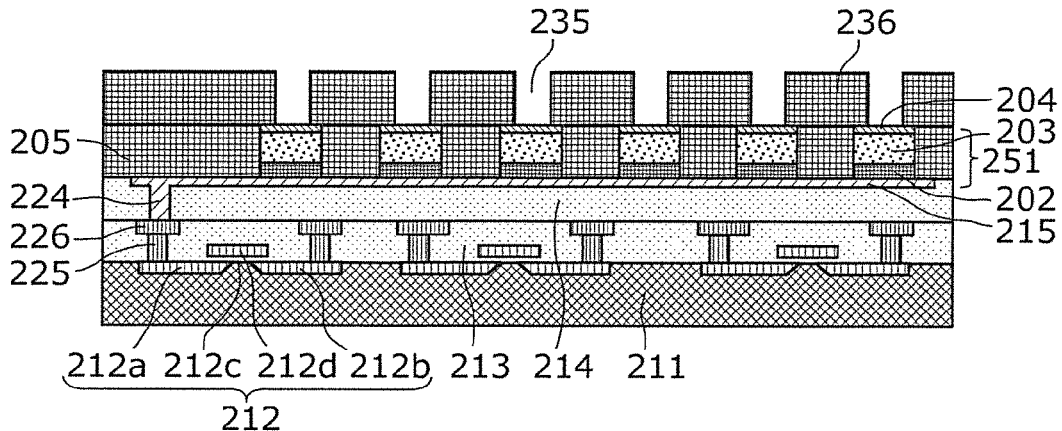
FIG. 8D is a cross-sectional view (a cross-sectional view of a state in which a second interlayer dielectric, which is for a conductor inside a contact hole, is formed) of the nonvolatile semiconductor memory device in a process subsequent to the process shown in FIG. 8C.

Then, as shown in FIG. 8C, the interlayer dielectric 205 is formed in a region other than the variable resistance element 251. Subsequently, as shown in FIG. 8D, a second interlayer dielectric 236, which is for a conductor inside a contact hole 235, is formed. As the interlayer dielectric 205 and the second interlayer dielectric 236, silicon oxide is used, for example.

In Embodiment 2, the variable resistance element 251 and the current steering element 252 are connected through the embedded conductor 237. Thus, even when a polishing in a process of FIG. 8C is performed somewhat excessively resulting in an exposure of an end surface of the variable resistance layer 203, the exposed portion is covered by the second interlayer dielectric 236 in the process shown in FIG. 8D. Thus, there is no fear of shortening between the variable resistance element 251 and other structural elements. Thus, a protective layer 111 shown in Embodiment 1 does not have to be formed.

Figure 8E:
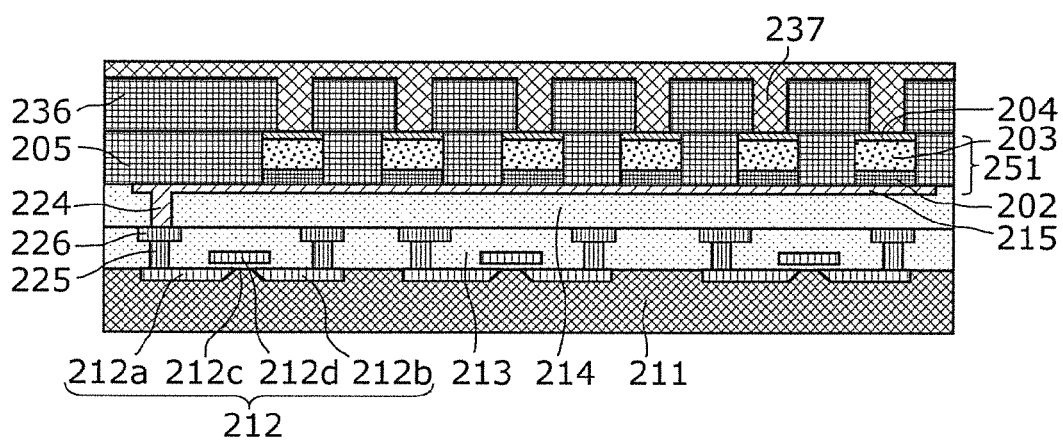
FIG. 8E is a cross-sectional view (a cross-sectional view of a state in which an embedded conductor is formed) of the nonvolatile semiconductor memory device in a process subsequent to the process shown in FIG. 8D.
Figure 8F:
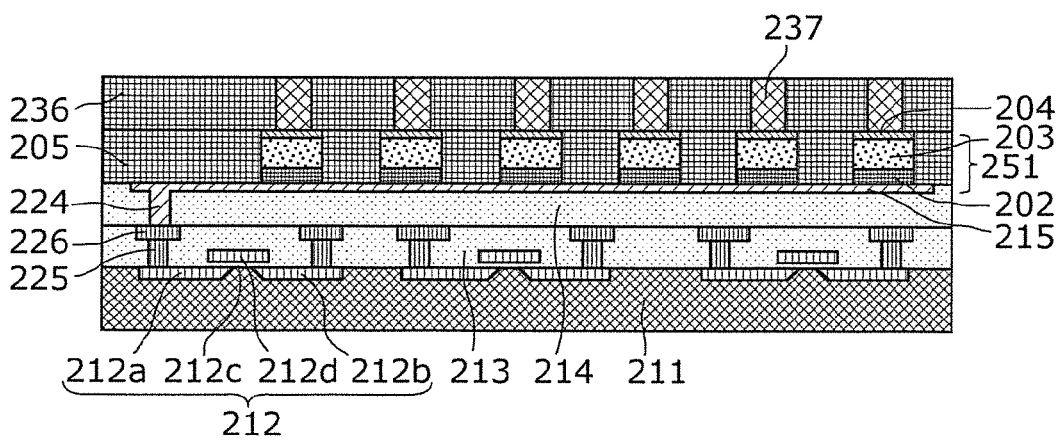
FIG. 8F is a cross-sectional view (a cross-sectional view of a state in which an unnecessary embedded conductor is removed by CMP) of the nonvolatile semiconductor memory device in a process subsequent to the process shown in FIG. 8E.

Next, as shown in FIG. 8E, the embedded conductor 237 is formed on the second interlayer dielectric 236 which includes the contact holes 235, and only an embedded conductor which covers the surface of the second interlayer dielectric 236 is removed through a CMP process. The embedded conductor 237 is thus formed in the contact hole 235 (FIG. 8F). Tungsten may be used as the embedded conductor, for example.

Figure 8G:
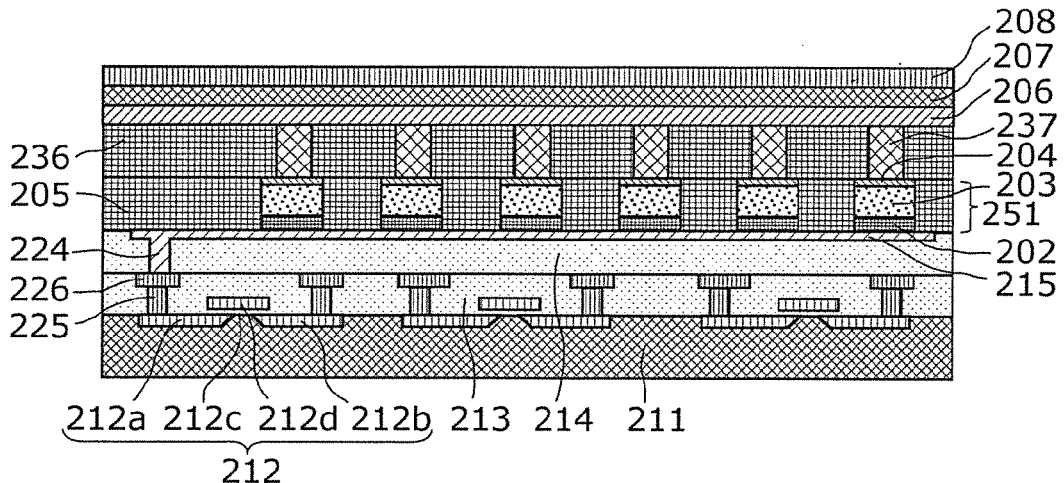
FIG. 8G is a cross-sectional view (a cross-sectional view of a state in which a first current steering element electrode, a first current steering layer, and a second current steering element electrode are stacked) of the nonvolatile semiconductor memory device in a process subsequent to the process shown in FIG. 8F.
Figure 8H:
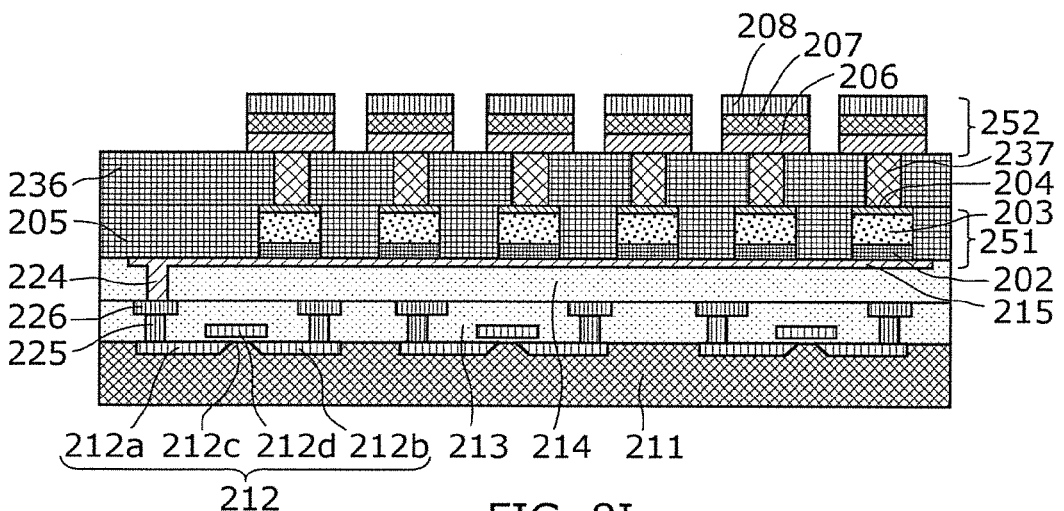
FIG. 8H is a cross-sectional view (a cross-sectional view of a state in which formation into a desired shape is performed to form a current steering element) of the nonvolatile semiconductor memory device in a process subsequent to the process shown in FIG. 8G.

After this, as shown in FIG. 8G, the first current steering element electrode 206, the first current steering layer 207, and the second current steering element electrode 208 are stacked on the second interlayer dielectric 236 and the embedded conductor 237. In this embodiment, as with Embodiment 1, for example, a tantalum nitride thin-film having a thickness of 20 nm is formed as each of the first current steering element electrode 206 and the second current steering element electrode 208, and a nitrogen-deficient silicon nitride thin-film is formed as the first current steering layer 207 using a reactive sputtering method. The thickness of the first current steering layer 207 is, for example, in the range of 5 nm to 20 nm. Then, as shown in FIG. 8H, the first current steering element electrode 206, the first current steering layer 207, and the second current steering element electrode 208 are patterned into a desired shape through a process, such as dry etching, to form a main body portion of the current steering element 252. In the case of this configuration in which both the first current steering element electrode 206 and the second current steering element electrode 208 comprise tantalum nitride, the current steering element 252 functions as a bidirectional MSM diode as described in Embodiment 1.

Figure 8I:
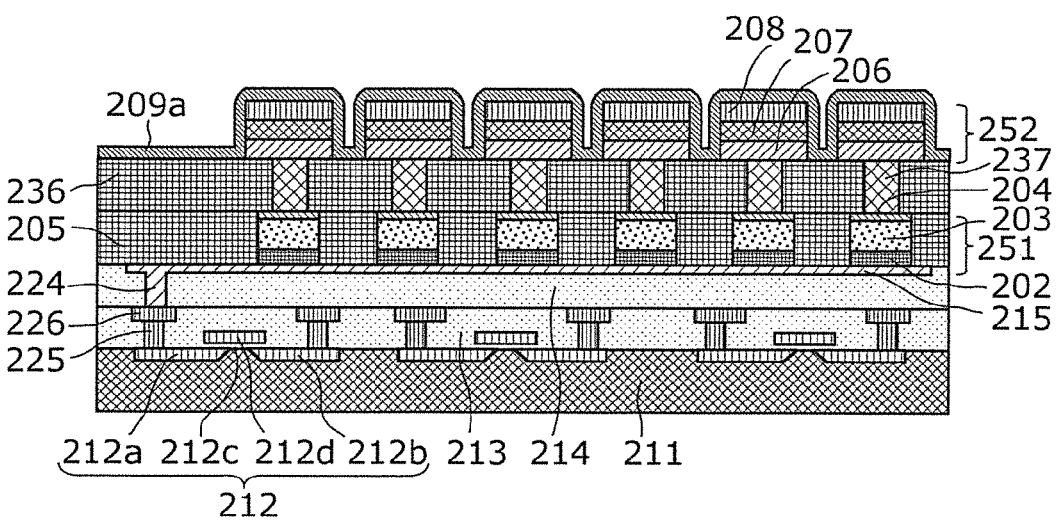
FIG. 8I is a cross-sectional view (a cross-sectional view of a state in which a second current steering layer is formed) of the nonvolatile semiconductor memory device in a process subsequent to the process shown in FIG. 8H.
Figure 8J:
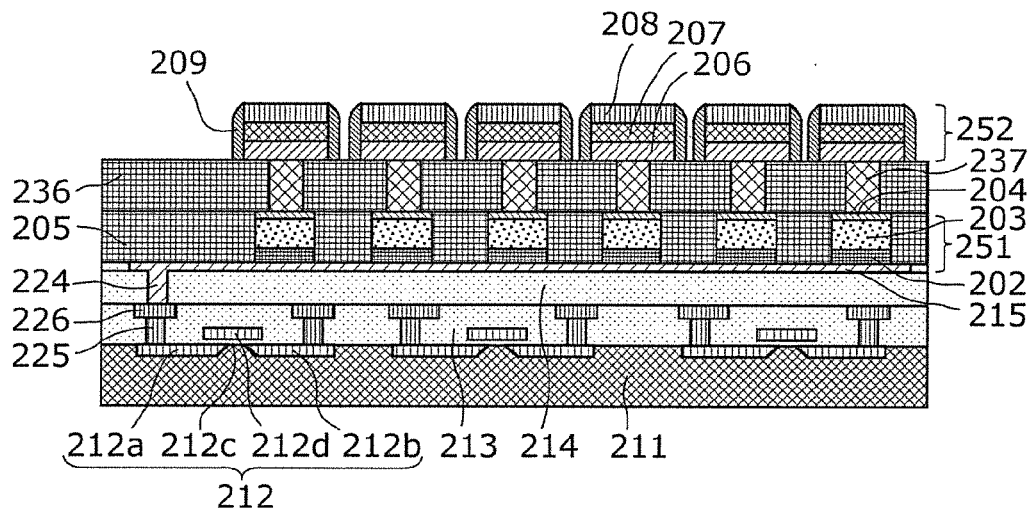
FIG. 8J is a cross-sectional view (a cross-sectional view of a state in which a second current steering layer that connects a side surface of a first current steering element electrode and a side surface of a second current steering element electrode of the current steering element are formed) of the nonvolatile semiconductor memory device in a process subsequent to the process shown in FIG. 8I.

After this, as shown in FIG. 8I, a nitrogen-deficient silicon nitride film 209a for forming the second current steering layer 209 is formed on an entire surface of the current steering element 252 and the second interlayer dielectric 236. The thickness of the nitrogen-deficient silicon nitride film 209a is, for example, 20 nm. Then, anisotropic etching is performed on the nitrogen-deficient silicon nitride film 209a to form the second current steering layer 209 which (i) covers the side surface of each of the first current steering element electrode 206, the first current steering layer 207, and the second current steering element electrode 208 of the current steering element 252 and (ii) is connected to the side surfaces of these three layers, as shown in FIG. 8J. Here, as the second current steering layer 209, a nitrogen-deficient silicon nitride thin-film is formed using the reactive sputtering method. As described with reference to FIG. 4 and FIG. 5, with the miniaturization of the element, the ratio of an amount of current flowing in the second current steering layer 209 with respect to an amount of current flowing in the first current steering layer 207 becomes higher. Thus, the present application is effective against the decrease in an amount of on-current that is expected to occur with the miniaturization of the nonvolatile semiconductor memory element. Note that, the first current steering layer 207 and the second current steering layer 209 may have the same composition. However, use of, as the second current steering layer 209, a nitrogen-deficient silicon nitride thin-film having a lower nitrogen content atomic percentage than the first current steering layer 207 is inferred to be a more preferable embodiment because an amount of current flowing to the second current steering layer 209 is ensured, which is also shown by FIG. 6.

Figure 8K:
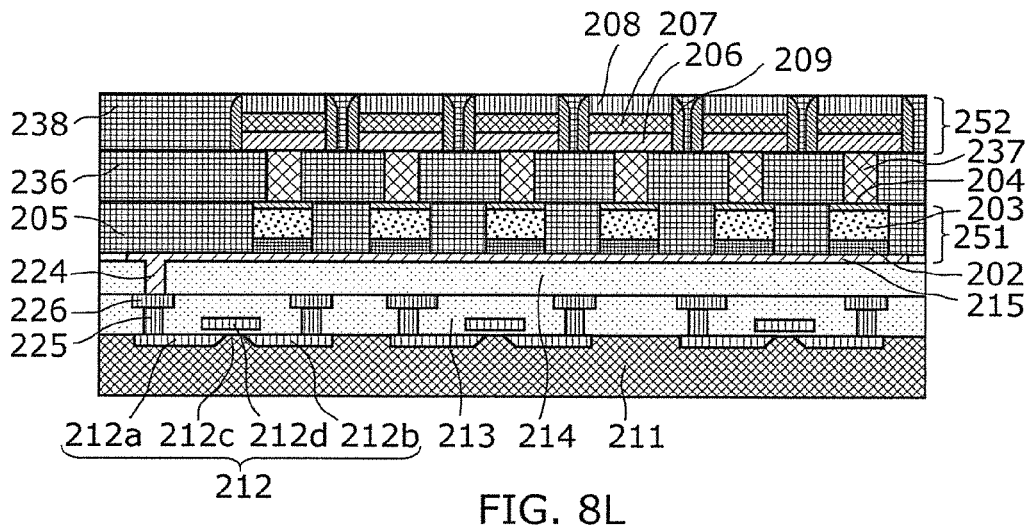
FIG. 8K is a cross-sectional view (a cross-sectional view of a state in which a third interlayer dielectric is formed) of the nonvolatile semiconductor memory device in a process subsequent to the process shown in FIG. 8J.
Figure 8L:
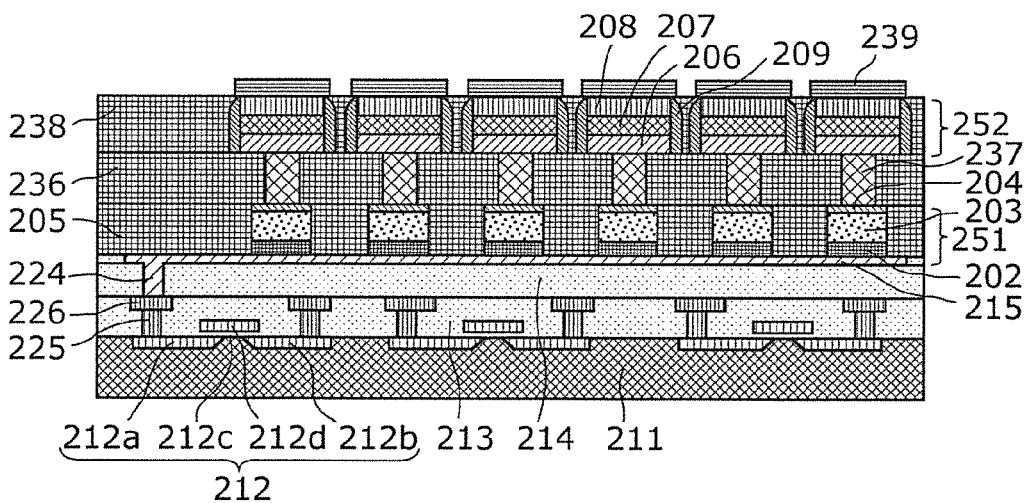
FIG. 8L is a cross-sectional view (a cross-sectional view of a state in which an upper layer electrode line is formed on the second current steering element electrode) of the nonvolatile semiconductor memory device in a process subsequent to the process shown in FIG. 8K.

Lastly, after the third interlayer dielectric 238 is formed as shown in FIG. 8K, the upper layer electrode line 239 is formed on the second current steering element electrode 208 as shown in FIG. 8L. For example, the third interlayer dielectric 238 may comprise a silicon oxide. The upper layer electrode line 239 may comprise a material similar to the material included in the lower layer electrode line 215, and has a thickness of, for example, 200 nm.

Note that, this embodiment described the current steering element which uses, as each of the first current steering layer 207 and the second current steering layer 209, SiN. However, the present invention is not limited to such a configuration. For example, tantalum oxide (TaO), aluminum oxide (AlO), or titanium oxide (TiO) may be used. When TaO is used, any methods may be used, such as forming a Ta film and then form a TaO film using a dry thermal oxidation method, a we thermal oxidation method, or a plasma oxidation method, or directly forming a TaO film using a reactive sputtering method. At this time, the first current steering layer 207 and the second current steering layer 209 may comprise the same material or different materials. For example, the first current steering layer 207 may comprise SiN, and the second current steering layer 209 may comprise tantalum oxide (TaO).

Furthermore, the upper layer electrode line 239 is formed so as to be connected to the upper electrode 222 outside the region in which the variable resistance elements 251 and the current steering elements 252 are formed in a matrix. The upper layer electrode line 239 may also comprise a material similar to the material included in the lower layer electrode line 215. Then, when the upper layer electrode line 239 is formed, the embedded conductor 228 is also formed at the same time. The upper layer electrode line 239 is connected to an electrode line (not shown) through the embedded conductor 228 and electrically connected to an active element provided at a position not shown in the drawing. After this, an insulating protective layer 223 which covers the upper electrode 222 and an upper layer electrode line 227 are formed. The nonvolatile semiconductor memory device 200 shown in FIG. 7A can be thus formed.

In the nonvolatile semiconductor memory device 200 according to this embodiment that is manufactured according to the above-described manufacturing method, the bidirectional current steering element 252 included in the nonvolatile semiconductor memory device 200 has a structure including the second current steering layer 209 which covers a side surface of each of the first current steering element electrode 206, the first current steering layer 207, and the second current steering element electrode 208. Thus, it is possible to increase an effective area (a cross-sectional area of the path through which a current flows) of the current steering element 252 to be larger than an effective area of the variable resistance element 251. Thus, in the nonvolatile semiconductor memory device 200 according to this embodiment, it is possible to increase a current (on-current) in a state in which an application voltage is high (on-state). In particular, it becomes possible to provide a current (on-current) even when an element is miniaturized. With this, even when density of nonvolatile semiconductor memory elements included in the nonvolatile semiconductor memory device is increased, a stable operation is achieved.

More specifically, the current steering element 252 included in the nonvolatile semiconductor memory device 200 according to this embodiment includes the second current steering layer 209 which covers the side surface of each of the first current steering element electrode 206, the first current steering layer 207, and the second current steering element electrode 208. A current flows in the second current steering layer 209 as well, and thus is effective in that an on-current can be provided even when the nonvolatile semiconductor memory element is miniaturized.

Furthermore, in general, when the voltage applied to the MSM diode increases and the current that flows in the diode increases, the temperature of the MSM diode rises due to Joule heating (on-region). The current density of the MSM diode exponentially increases when the temperature rises. This causes a further increase in temperature resulting in a failure, such as shorting, when a critical temperature is reached. The shorting occurs in the central part of the bidirectional diode which is where heat dissipation efficiency is the lowest.

On the other hand, the bidirectional current steering element 252 according to this embodiment includes the second current steering layer 209 that is provided on the end surface of the current steering element 252. Thus, adhesion between the current steering element 252 and the third interlayer dielectric 238 is good, heat dissipation from the current steering element 252 to the third interlayer dielectric 238 occurs easily, and the rise in temperature of the bidirectional current steering element 252 as a whole can be reduced.

Embodiment 3

Figure 9A:
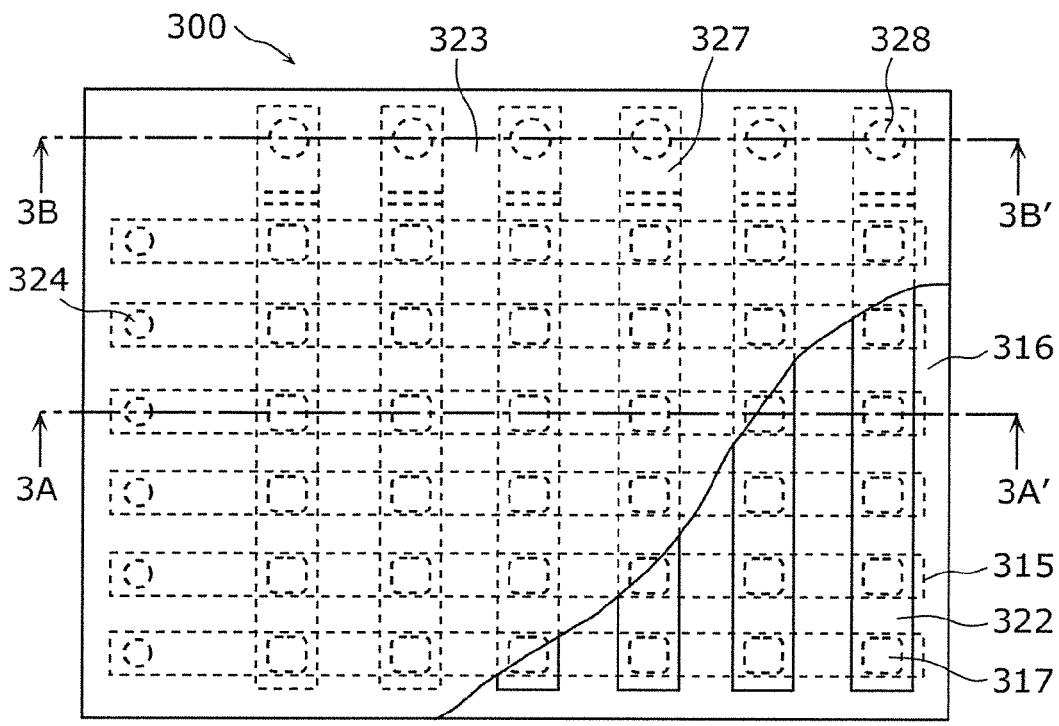
FIG. 9A is a plan view of a nonvolatile semiconductor memory device according to Embodiment 3.
Figure 9B:
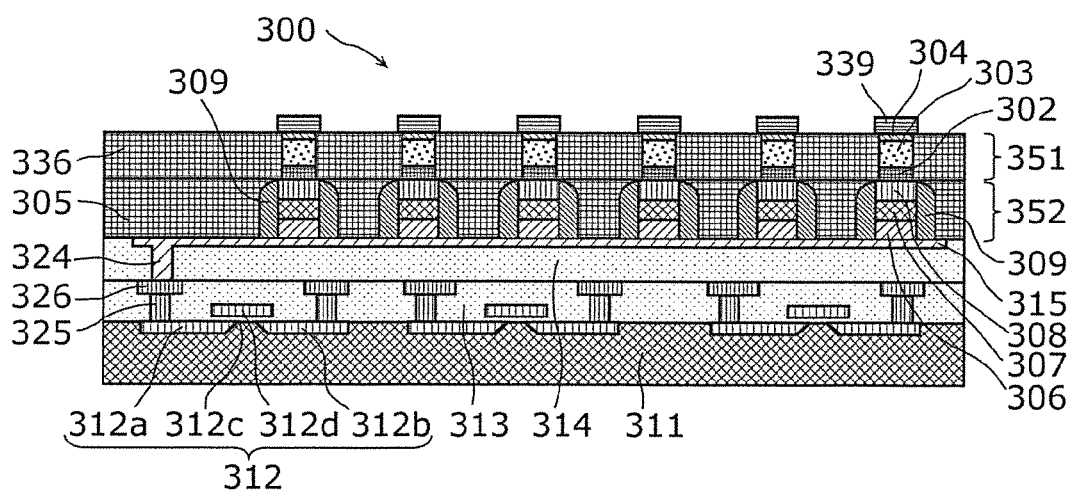
FIG. 9B is a cross-sectional view taken along line 3A-3A' shown in FIG. 9A.
Figure 9C:
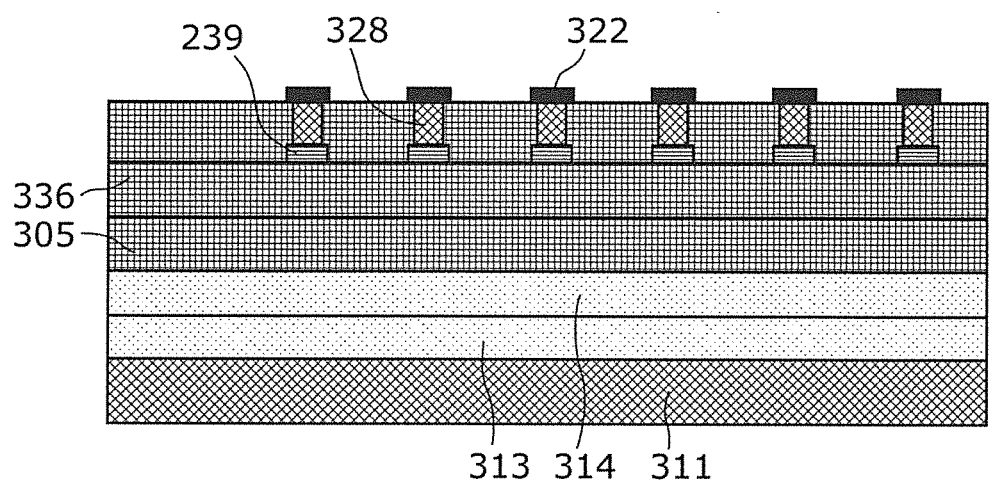
FIG. 9C is a cross-sectional view taken along line 3B-3B' shown in FIG. 9A.

Each of FIG. 9A to FIG. 9C is a cross-sectional view for describing a structure of a nonvolatile semiconductor memory device 300 according to Embodiment 3 of the present invention. The nonvolatile semiconductor memory device 300 is a device having a cross-point array structure, which is formed by arranging a plurality of elements each of which is an element shown in FIG. 1C as a variation of Embodiment 1. Note that, in the plan view shown in FIG. 9A, an insulating protective layer (first interlayer dielectric) 323 which is the uppermost layer is partially cut out for ease of comprehension. FIG. 9B is a cross-sectional view as viewed from the direction of the arrow along the line 3A-3A' in FIG. 9A. Note that, in FIG. 9B, illustration of the insulating protective layer (a first interlayer dielectric) 323 shown in FIG. 9A is omitted. FIG. 9C is a cross-sectional view taken along line 3B-3B' shown in FIG. 9A.

This embodiment 3 is different from Embodiments 1 and 2 in that (i) a variable resistance element 351 and a current steering element 352 are not connected through an embedded conductor but are directly connected, and (ii) an arrangement of the variable resistance element and the current steering element in the vertical direction is different.

More specifically, the nonvolatile semiconductor memory device 300 according to this embodiment includes: a substrate 311; lower electrode lines 315 which are formed on the substrate 311 and are in a stripe pattern; an interlayer dielectric 305 which is provided, on the substrate 311 including the lower electrode lines 315, on the lower electrode lines 315; a plurality of the current steering elements 352 connected to the lower electrode lines 315; and a plurality of the variable resistance element 351 which are formed on the current steering elements 352 and each of which is connected to a corresponding one of the current steering element 352.

In addition, each of the current steering elements 352 is a bidirectional current steering element which includes (i) a stacked structure of three layers, namely, a first current steering element electrode 306 that is a metal electrode assembly layer and is in a plane shape, a second current steering element electrode 308 that is a metal electrode assembly layer and is in a plane shape, and a first current steering layer 307 in a plane shape and (ii) a second current steering layer 309 which covers a side surface of each of the first current steering element electrode 306, the second current steering element electrode 308, and the first current steering layer 307. Note that, it is acceptable that the second current steering layer 309 cover the side surface of the first current steering layer 307, and at least a portion of a side surface of the first current steering element electrode 306 and the second current steering element electrode 308.

In addition, in this embodiment, upper electrodes 322 are formed, on a second interlayer dielectric 336, in a stripe pattern and three-dimensionally cross the lower electrode lines 315.

Furthermore, each of the variable resistance elements 351 includes a first electrode 302, a variable resistance layer 303, and a second electrode 304.

Note that, as shown in FIG. 9A, the lower layer electrode lines 315 and the upper electrodes 322 extend to outside of the region (a storage unit 317) in which the variable resistance elements 351 and the current steering elements 352 are formed in a matrix. Furthermore, as shown in FIG. 9C, the upper electrodes 322 are connected to upper layer electrode lines 339 through embedded conductors 328 outside the matrix region. Furthermore, in the matrix region, the upper electrodes 322 also function as upper layer electrode lines.

In addition, in this embodiment, a silicon single crystal substrate is used as the substrate 311. The substrate 311 includes a semiconductor circuit in which active elements 312, such as a transistor, are integrated. FIG. 9B shows, as the active elements 312, transistors each of which includes a source region 312a, a drain region 312b, a gate dielectric 312c, and a gate electrode 312d. However, the active element 312 includes not only a transistor, but includes an element, such as a DRAM, which is generally necessary for a memory circuit.

The lower layer electrode lines 315 and the upper layer electrode lines 339 are connected to the active elements 312 in a region different from the matrix region in which the variable resistance elements 351 and the current steering elements 352 are formed. Specifically, in FIG. 9B, the lower layer electrode line 315 is connected, through embedded conductors 324 and 325 and an electrode line 326, to a source region 312a of the active element 312. Furthermore, likewise, the upper layer electrode line 339 is also connected to a different active element (not shown) through an embedded conductor (not shown).

Note that, materials included in structural elements are similar to the materials described in Embodiment 2, and thus the descriptions thereof are omitted.

As described, the nonvolatile semiconductor memory device 300 according to Embodiment 3 has a structure in which, the variable resistance element 351 is directly stacked on the current steering element 352, and the second current steering layer 309 can also play the role of a protective layer 111 described in Embodiment 1. Thus, it is possible to simplify the manufacturing process.

A process for manufacturing the nonvolatile semiconductor memory device 300 according to this embodiment is shown in FIG. 10A to FIG. 10I. This embodiment is different from Embodiment 2 in that a process for forming the embedded conductor is not included, and the order for forming the variable resistance element and the current steering element is reversed. The following describes processes for manufacturing the nonvolatile semiconductor memory device 300 according to this embodiment, focusing mainly on the differences from Embodiment 2.

Figure 10A:
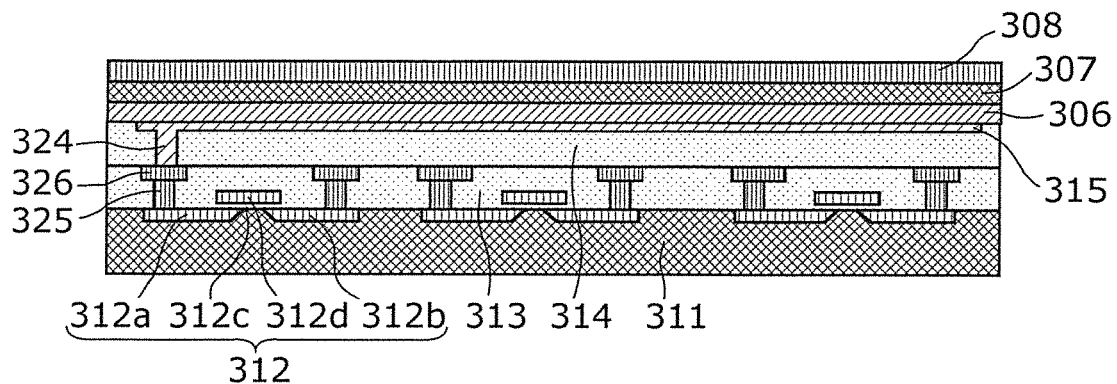
FIG. 10A is a cross-sectional view of a nonvolatile semiconductor memory device in a first process in a method for manufacturing the nonvolatile semiconductor memory device according to Embodiment 3 (a cross-sectional view of a state in which a first current steering element electrode, a first current steering layer, and a second current steering element electrode are stacked on a substrate including an active element).

FIG. 10A is a cross-sectional view of a state in which the first current steering element electrode 306, the first current steering layer 307, and the second current steering element electrode 308 are formed on the substrate 311 on which the active elements 312 are formed. First, as shown in FIG. 10A, the first current steering element electrode 306, the first current steering layer 307, and the second current steering element electrode 308 are stacked on the substrate 311 on which a plurality of the active elements 312, an electrode line 326, and interlayer dielectrics 313 and 314 are formed. In this embodiment, as with Embodiment 1, a tantalum nitride thin-film is formed as each of the first current steering element electrode 306 and the second current steering element electrode 308, and a nitrogen-deficient silicon nitride thin-film is formed as the first current steering layer 307 using a reactive sputtering method. The thickness of the first current steering element electrode 306 and the second current steering element electrode 308 is, for example, 20 nm. The thickness of the first current steering layer 307 is, for example, 30 nm.

Figure 10B:
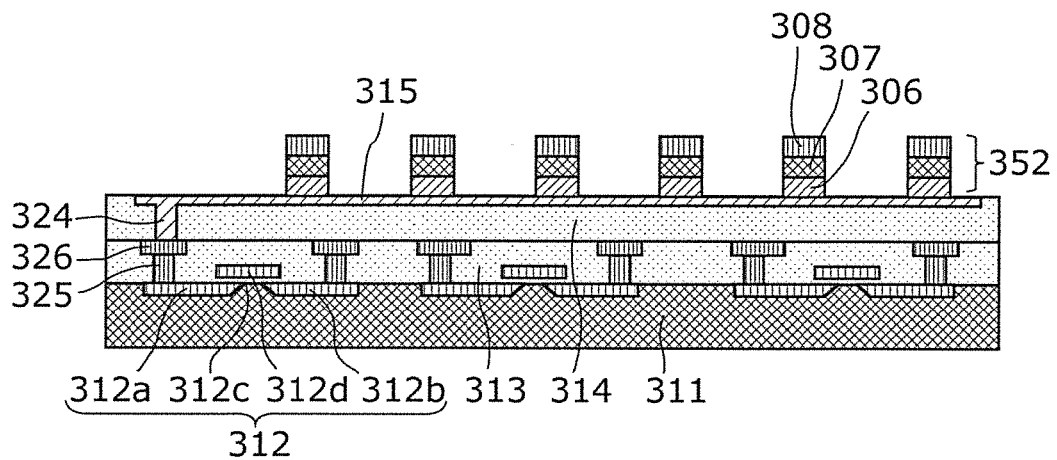
FIG. 10B is a cross-sectional view (a cross-sectional view of a state in which a formation into a desired shape is performed to form a current steering element) of the nonvolatile semiconductor memory device in a process subsequent to the process shown in FIG. 10A.

Then, as shown in FIG. 10B, the first current steering element electrode 306, the first current steering layer 307, and the second current steering element electrode 308 are patterned into a desired shape through a process, such as dry etching, to form a main body portion of the current steering element 352. In the case of this configuration in which both the first current steering element electrode 306 and the second current steering element electrode 308 comprise tantalum nitride, the current steering element 352 functions as a bidirectional MSM diode as described in Embodiment 1.

Figure 10C:
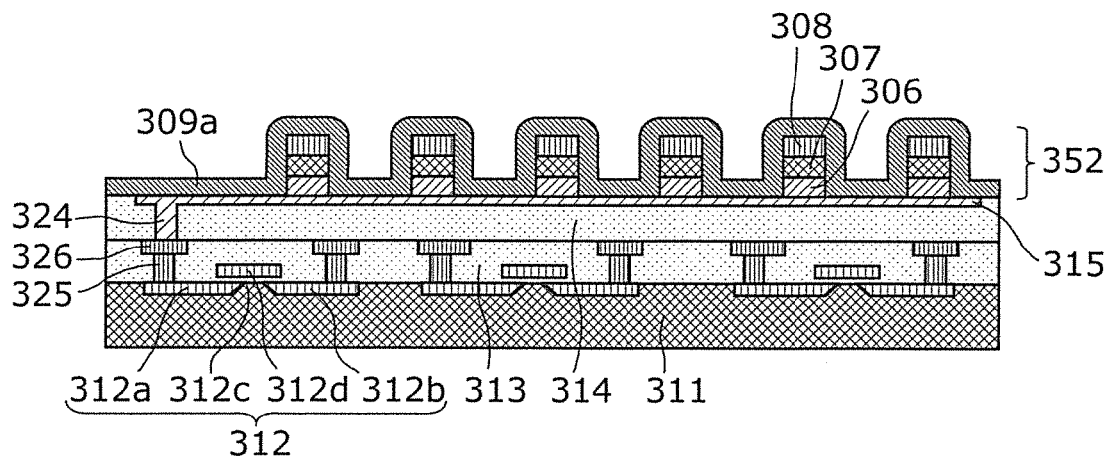
FIG. 10C is a cross-sectional view (a cross-sectional view of a state in which a second current steering layer is formed) of the nonvolatile semiconductor memory device in a process subsequent to the process shown in FIG. 10B.
Figure 10D:
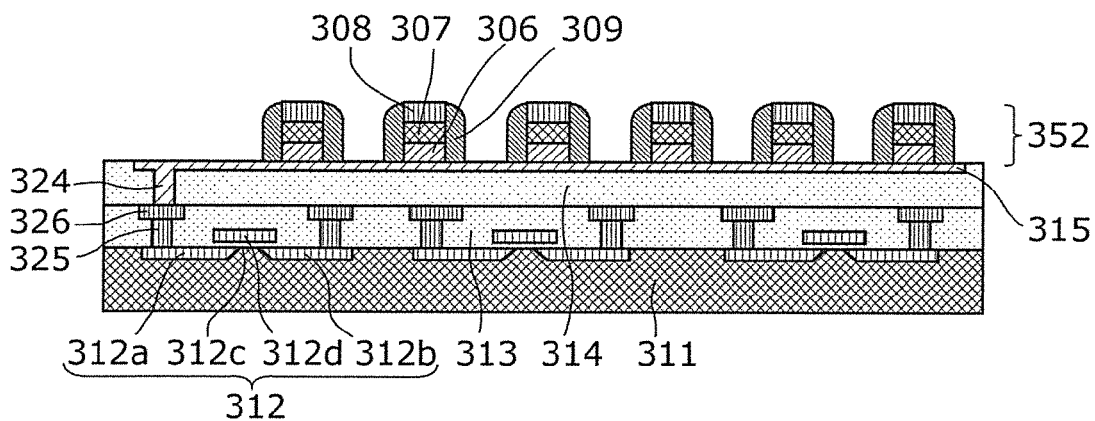
FIG. 10D is a cross-sectional view (a cross-sectional view of a state in which a second current steering layer which connects a side surface of a first current steering element electrode and a side surface of a second current steering element electrode of the current steering element are formed) of the nonvolatile semiconductor memory device in a process subsequent to the process shown in FIG. 10C.

After this, as shown in FIG. 10C, a nitrogen-deficient silicon nitride film 309a for forming the second current steering layer 309 is formed on the entire surface of the current steering element 352 and the second interlayer dielectric 336. The thickness of the nitrogen-deficient silicon nitride film 309a is, for example, 20 nm. Then, anisotropic etching is performed on the nitrogen-deficient silicon nitride film 309a to form the second current steering layer 309 which (i) covers the side surface of each of the first current steering element electrode 306, the first current steering layer 307, and the second current steering element electrode 308 of the current steering element 352 and (ii) is connected to the side surfaces of these three layers, as shown in FIG. 10D. Here, as the second current steering layer 309, a nitrogen-deficient silicon nitride thin-film is formed using a reactive sputtering method. As described with reference to FIG. 4 and FIG. 5, with the miniaturization of the nonvolatile semiconductor memory element, the ratio of an amount of current flowing in the second current steering layer 309 with respect to an amount of current flowing in the first current steering layer 307 increases. Thus, the present application is effective against the decrease in an amount of on-current that is expected to occur with the miniaturization of the nonvolatile semiconductor memory element.

Figure 10E:
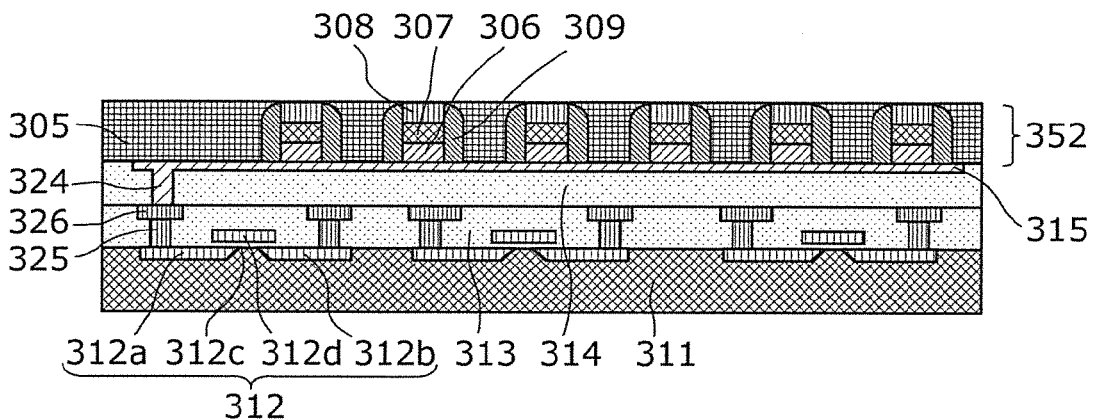
FIG. 10E is a cross-sectional view (a cross-sectional view of a state in which an interlayer dielectric is formed other than on a current steering element) of the nonvolatile semiconductor memory device in a process subsequent to the process shown in FIG. 10D.
Figure 10F:
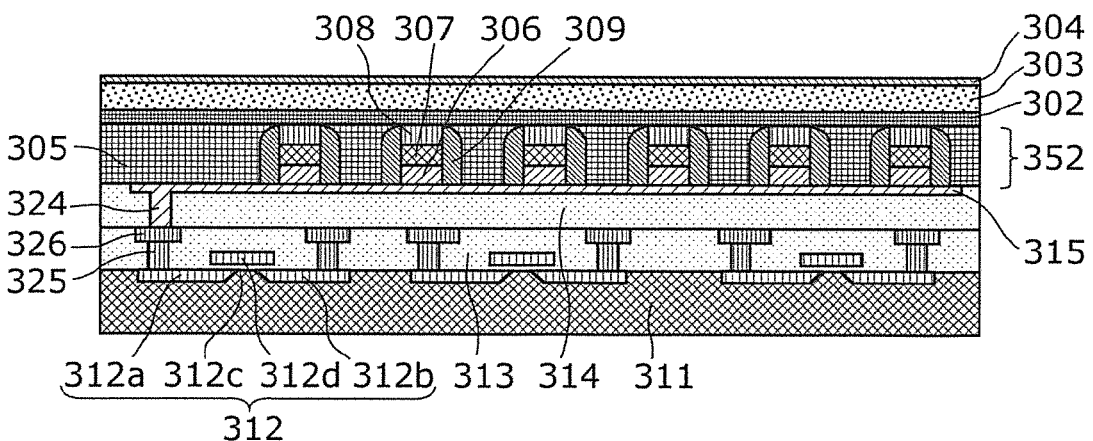
FIG. 10F is a cross-sectional view (a cross-sectional view of a state in which a first electrode, a variable resistance layer, and a second electrode are formed) of the nonvolatile semiconductor memory device in a process subsequent to the process shown in FIG. 10E.

Then, after forming the interlayer dielectric 305 (e.g., silicon oxide) as shown in FIG. 10E, the first electrode 302, the variable resistance layer 303, and the second electrode 304 are formed on the interlayer dielectric 305 and the second current steering element electrode 308 as shown in FIG. 10F using a sputtering method, for example. For example, TaN is formed as the first electrode 302, an oxygen-deficient tantalum oxide ($TaO_x$) is formed as the variable resistance layer 303, and Ir is formed as the second electrode 304. The film thickness of each of the layers is, for example, as follows. The first electrode 302 has a thickness of 20 nm, the variable resistance layer 303 has a thickness of 30 nm, and the second electrode 304 has a thickness of 30 nm.

Figure 10G:
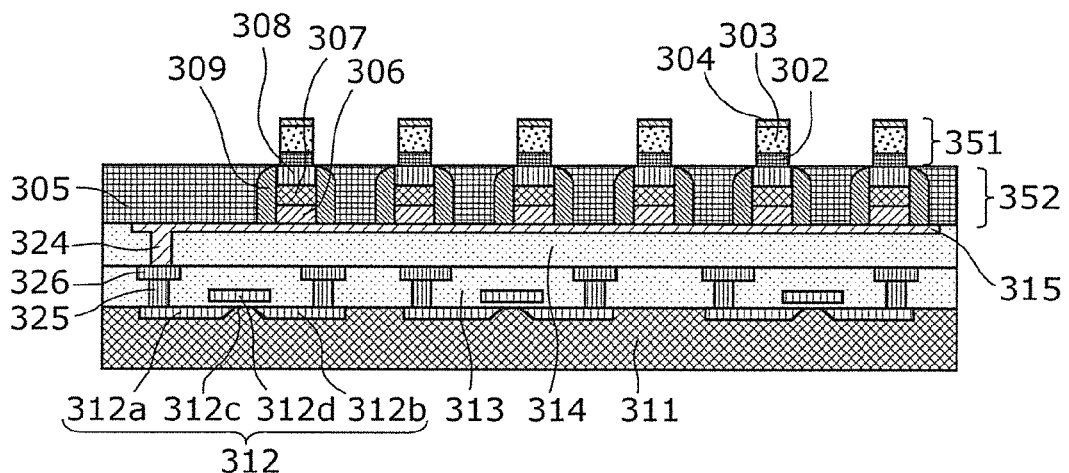
FIG. 10G is a cross-sectional view (a cross-sectional view of a state in which a formation into a desired shape is performed to form a variable resistance element) of the nonvolatile semiconductor memory device in a process subsequent to the process shown in FIG. 10F.

After this, as shown in FIG. 10G, the variable resistance element 351 is formed by forming the first electrode 302, the variable resistance layer 303, and the second electrode 304 into a desired shape through a process, such as dry etching.

Figure 10H:
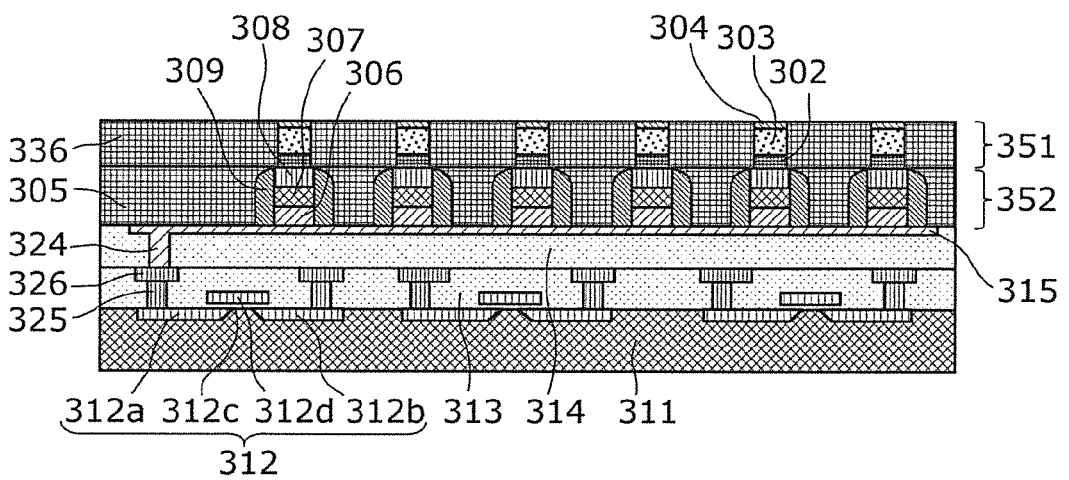
FIG. 10H is a cross-sectional view (a cross-sectional view of a state in which a second interlayer dielectric is formed) of the nonvolatile semiconductor memory device in a process subsequent to the process shown in FIG. 10G.
Figure 10I:
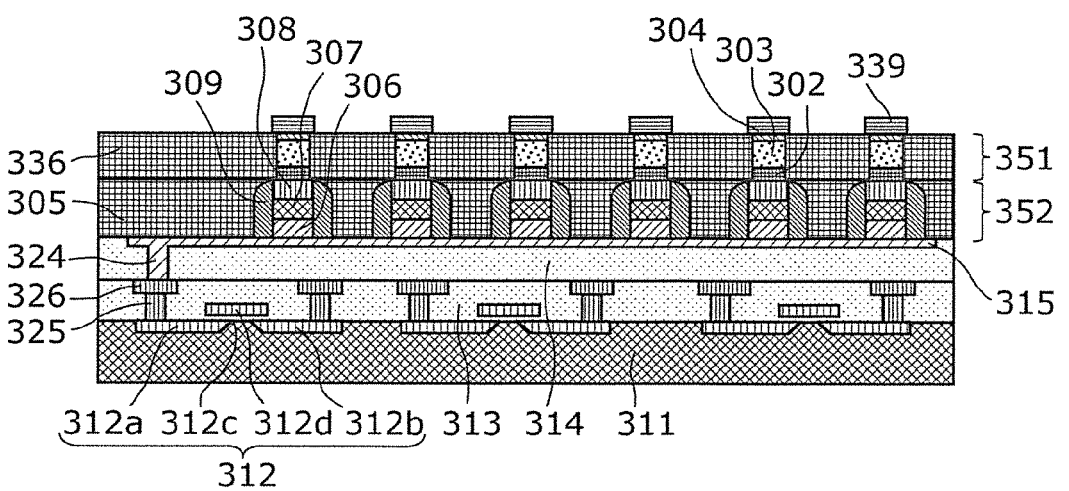
FIG. 10I is a cross-sectional view (a cross-sectional view of a state in which an upper layer electrode line is formed on a second electrode) of the nonvolatile semiconductor memory device in a process subsequent to the process shown in FIG. 10H.
Figure 11:
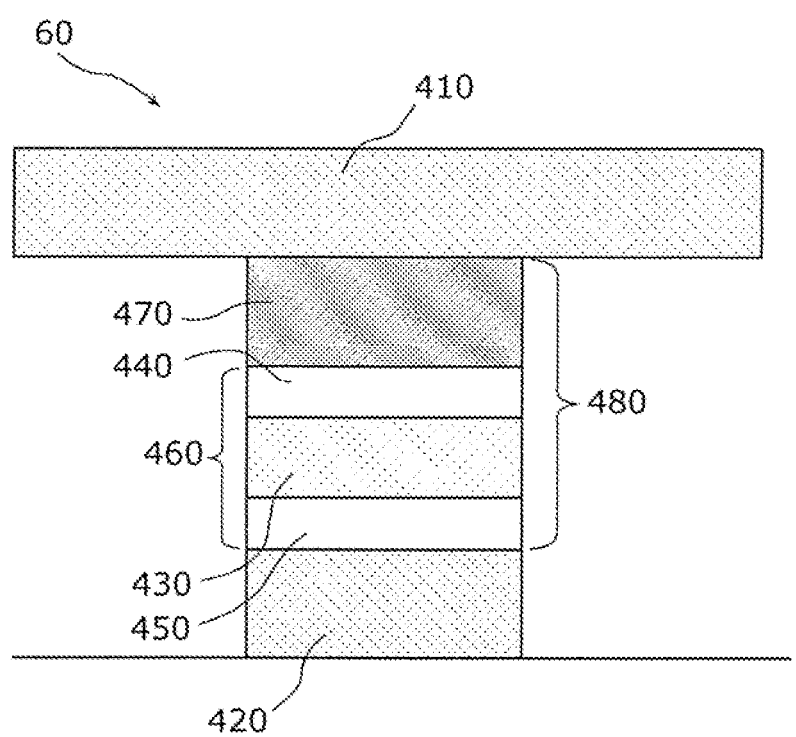
FIG. 11 is a diagram showing an exemplary configuration of a conventional ordinary variable resistance nonvolatile semiconductor memory element.

Then, as shown in FIG. 10H, the second interlayer dielectric 336 is formed in a region other than the variable resistance element 351. The second interlayer dielectric 336 may comprise a silicon oxide, for example. Subsequently, as shown in FIG. 10I, the upper layer electrode line 339 is formed on the second electrode 304. For example, the upper layer electrode line 339 may comprise aluminum and has a film thickness of, for example, 30 nm.

Note that the upper layer electrode lines 339 are formed so as to connect to the upper electrodes 322 outside the region in which the variable resistance elements 351 and the current steering elements 352 are formed in a matrix. The upper layer electrode lines 339 may comprise a material similar to the material included in the lower electrode line 315. Then, when forming the upper layer electrode line 327, the embedded conductor 328 is also formed at the same time. The upper layer electrode line 327 is connected to an electrode line (not shown) through the embedded conductor 328 and electrically connected to an active element provided at a position not shown in the drawing. After this, an insulating protective layer 323 which covers the upper electrode 322 and the upper layer electrode line 327 are formed. The nonvolatile semiconductor memory device 300 shown in FIG. 9A can be thus formed.

In the nonvolatile semiconductor memory device 300 according to this embodiment that is manufactured according to the above-described manufacturing method, the bidirectional current steering element 352 included in the nonvolatile semiconductor memory device 300 has a structure including the second current steering layer 309 which covers a side surface of each of the first current steering element electrode 306, the first current steering layer 307, and the second current steering element electrode 308. Thus, it is possible to increase an effective area (a cross-sectional area of the path through which a current flows) of the current steering element 352 to be larger than an effective area of the variable resistance element 351. Thus, in the nonvolatile semiconductor memory device 300 according to this embodiment, it is possible to increase a current (on-current) in a state in which an application voltage is high (on-state). In particular, it becomes possible to provide a current (on-current) even when an element is miniaturized. With this, even when density of nonvolatile semiconductor memory elements included in the nonvolatile semiconductor memory device is increased, a stable operation is achieved.

More specifically, the current steering element 352 in the nonvolatile semiconductor memory device 300 according to this embodiment includes the second current steering layer 309 which covers the side surface of each of the first current steering element electrode 306, the first current steering layer 307, and the second current steering element electrode 308. A current flows in the second current steering layer 309 as well, which is effective in that an on-current can be provided even when the nonvolatile semiconductor memory element is miniaturized.

In addition, in the current steering element 352 according to this embodiment, the second current steering layer 309 is provided on the side end surface of the current steering element 352. With this, adhesion between the current steering element 352 and the interlayer dielectric 305 improves. Thus, the heat emitted due to on-current in the current steering element 352 can be more efficiently dissipated to the interlayer dielectric 305.

Although the nonvolatile semiconductor memory element and the nonvolatile semiconductor memory device according to the present invention have thus far been described based on Embodiments 1 to 3, the present invention is not limited to such embodiments. For example, embodiments resulting from various modifications of the exemplary embodiments as well as embodiments resulting from combinations of arbitrary structural elements of the different exemplary embodiments that may be conceived by those skilled in the art are intended to be included within the scope of the present invention.

For example, instead of the MSM (metal-semiconductor-metal) diode described in the above embodiments, the current steering element 122 may include an MIM (metal-insulator-metal) diode. An insulator comprises, for example, $SiO_2$, or the like.

In other words, an aspect of a nonvolatile semiconductor memory element according to the present invention may include (1) a variable resistance element including a first electrode, a variable resistance layer, and a second electrode, and having a resistance value which changes according to a polarity of an electric pulse applied between the first electrode and the second electrode; and (2) a current steering element which is electrically connected to the variable resistance element, allows a current to flow bidirectionally, and has a nonlinear current-voltage characteristic. Furthermore, the current steering element may (i) have a structure in which a first current steering element electrode in a plane shape, a dielectric in a plane shape, and a second current steering element electrode in a plane shape are stacked in this order, and (ii) include a semiconductor layer which covers a side surface of the dielectric, a side surface of the first current steering element electrode, and a side surface of the second current steering element electrode.

A bidirectional current steering element included in such a nonvolatile semiconductor memory element has a structure including a semiconductor layer which is connected to a side surface of each of a first current steering element electrode, the dielectric, and the second current steering element electrode. This makes it possible to increase a current (on-current) in the state in which the applied voltage is high (on-state). In particular, it becomes possible to provide a current (on-current) even when an element is miniaturized, producing an advantageous effect of ensuring a stable operation even when density of nonvolatile semiconductor memory elements included in the nonvolatile semiconductor memory device is increased.

One of the methods for manufacturing such a nonvolatile semiconductor memory device includes (1) forming lower electrode lines in a stripe pattern on a substrate; (2) forming the first electrode on the lower layer electrode lines; (3) forming the variable resistance layer on the first electrode; (4) forming the second electrode on the variable resistance layer; (5) forming an interlayer dielectric to cover a top surface of the substrate, a side surface of the first electrode, a side surface of the variable resistance layer, and a side surface of the second electrode; (6) forming, on the second electrode, the first current steering element electrode in a plane shape; (7) forming, on the first current steering element electrode, the dielectric in a plane shape; (8) forming, on the dielectric, the second current steering element electrode in a plane shape; (9) exposing a top surface of the second current steering element electrode and forming the semiconductor layer which covers a side surface of the dielectric, a side surface of the first current steering element electrode, and a side surface of the second current steering element electrode, by performing anisotropic etching after depositing the semiconductor layer on the top and the side surfaces of the second current steering element electrode, on the side surface of the dielectric, and on the side surface of the first current steering element electrode; and (10) forming, on the second current steering element electrode, upper layer electrode lines which are in a stripe pattern and three-dimensionally cross the lower layer electrode lines.

Furthermore, another manufacturing method includes (1) forming lower electrode lines in a stripe pattern on a substrate; (2) forming, on the lower layer electrode lines, the first current steering element electrode in a plane shape; (3) forming, on the first current steering element electrode, the dielectric in a plane shape; (4) forming, on the dielectric, the second current steering element electrode in a plane shape; (5) exposing a top surface of the second current steering element electrode and forming the semiconductor layer which covers a side surface of the dielectric, a side surface of the first current steering element electrode, and a side surface of the second current steering element electrode, by performing anisotropic etching after depositing the semiconductor layer on the top and the side surfaces of the second current steering element electrode, on the side surface of the dielectric, and on the side surface of the first current steering element electrode; (6) forming the first electrode on the second current steering element electrode; (7) forming the variable resistance layer on the first electrode; (8) forming the second electrode on the variable resistance layer; and (9) forming, on the second electrode, upper layer electrode lines which are in a stripe pattern and three-dimensionally cross the lower layer electrode lines.

With either manufacturing method, it is possible to manufacture the nonvolatile semiconductor memory element according to the present invention which includes: the current steering element including the MIM diode; and the variable resistance element.

The present invention is useful as a nonvolatile semiconductor memory element, a nonvolatile semiconductor memory device and its manufacturing method, and is particularly useful as a nonvolatile semiconductor memory element, a nonvolatile semiconductor memory device and its manufacturing method which can ensure a stable switching characteristic of a current steering element even when miniaturized. For example, the present invention is useful in various electronic device fields that use a nonvolatile semiconductor memory device for storing data, such as music, images, and information.

REFERENCE SIGNS LIST 100, 100$a$, 100$b$, 100$c$ Nonvolatile semiconductor memory element (ReRAM)
101, 211, 311 Substrate
102, 202, 302 First electrode
103, 203, 303 Variable resistance layer
103$a$ First transition metal oxide layer
103$b$ Second transition metal oxide layer
104, 204, 304 Second electrode
105, 205, 305 Interlayer dielectric
106, 206, 306 First current steering element electrode
107, 207, 307 First current steering layer
108, 208, 308 Second current steering element electrode
109, 209, 309 Second current steering layer
109$a$, 209$a$, 309$a$ Nitrogen-deficient silicon nitride film
110 Common electrode
111 Protective layer
111$a$ Protective layer material
121, 251, 351 Variable resistance element
122, 252, 352 Current steering element
200, 300 Nonvolatile semiconductor memory device
212, 312 Active element
212$a$, 312$a$ Source region
212$b$, 312$b$ Drain region
212$c$, 312$c$ Gate dielectric
212$d$, 312$d$ Gate electrode
213, 214, 313, 314 Interlayer dielectric
215, 315 Lower layer electrode line
217, 317 Storage unit
222, 322 Upper electrode
223, 323 Insulating protective layer (first interlayer dielectric)
224, 225, 228, 324, 325, 328 Embedded conductor
226, 326 Electrode line
227, 327 Upper layer electrode line (first upper layer electrode line)
235 Contact hole
236, 336 Second interlayer dielectric
237, 337 Embedded conductor
238 Third interlayer dielectric
239, 339 Upper layer electrode line

The invention claimed is:

1. A nonvolatile semiconductor memory element, comprising:
a variable resistance element including a first electrode, a variable resistance layer, and a second electrode, the variable resistance element having a resistance value which changes according to a polarity of an electric pulse applied between the first electrode and the second electrode; and
a current steering element which is electrically connected to the variable resistance element, allows a current to flow bidirectionally, and has a nonlinear current-voltage characteristic,
wherein the current steering element (i) has a structure in which a first current steering element electrode having a flat surface, a first current steering layer having a flat surface, and a second current steering element electrode having a flat surface are stacked in an order, from closest to farthest from the variable resistance element, of the first current steering element electrode, the first current steering layer and a second current steering element electrode, and (ii) includes a second current steering layer which is provided on an outer side surface of the first current steering layer, on at least a portion of an outer side surface of the first current steering element electrode, and on at least a portion of an outer side surface of the second current steering element electrode,
wherein each of the first current steering layer and the second current steering layer comprises nitrogen-deficient silicon nitride, and
when the nitrogen-deficient silicon nitride included in the first current steering layer is denoted as SiN$_z$, and the nitrogen-deficient silicon nitride included in the second current steering layer is denoted as SiN$_w$, a relationship $$0.8 \geq z \geq w \geq 0.3$$

is satisfied.

2. The nonvolatile semiconductor memory element according to claim 1,
wherein the variable resistance layer includes a first transition metal oxide layer and a second transition metal oxide layer which are stacked.

3. The nonvolatile semiconductor memory element according to claim 2,
wherein the second transition metal oxide layer has a degree of oxygen deficiency lower than a degree of oxygen deficiency of the first transition metal oxide layer.

4. The nonvolatile semiconductor memory element according to claim 2,
wherein a transition metal included in the first transition metal oxide layer and a transition metal included in the second transition metal oxide layer are a same transition metal.

5. The nonvolatile semiconductor memory element according to claim 2,
wherein a transition metal included in the first transition metal oxide layer and a transition metal included in the second transition metal oxide layer are different.

6. A nonvolatile semiconductor memory device, comprising:
a substrate;
lower electrode lines formed in a stripe pattern on the substrate;

upper layer electrode lines which are formed in a stripe pattern and three-dimensionally cross the lower electrode lines; and a plurality of the nonvolatile semiconductor memory elements according to claim 1 formed at cross-points of the lower layer electrode lines and the upper layer electrode lines.

\* \* \* \* \*